United States Patent
Pavicic et al.

(10) Patent No.: US 11,594,687 B2
(45) Date of Patent: Feb. 28, 2023

(54) ORGANIC ELECTROLUMINESCENT DEVICE

(71) Applicant: Novaled GmbH, Dresden (DE)

(72) Inventors: Domagoj Pavicic, Dresden (DE);
Carsten Rothe, Dresden (DE);
Vygintas Jankus, Dresden (DE);
Regina Luschtinetz, Dresden (DE);
Jerome Ganier, Dresden (DE)

(73) Assignee: Novaled GmbH, Dresden (DE)

( * ) Notice: Subject to any disclaimer, the term of this patent is extended or adjusted under 35 U.S.C. 154(b) by 513 days.

(21) Appl. No.: 15/763,910

(22) PCT Filed: Sep. 27, 2016

(86) PCT No.: PCT/EP2016/072955
§ 371 (c)(1),
(2) Date: Mar. 28, 2018

(87) PCT Pub. No.: WO2017/055264
PCT Pub. Date: Apr. 6, 2017

(65) Prior Publication Data
US 2019/0058123 A1 Feb. 21, 2019

(30) Foreign Application Priority Data

Sep. 28, 2015 (EP) ..................................... 15187146
Aug. 26, 2016 (EP) ..................................... 16185999

(51) Int. Cl.
*H01L 51/00* (2006.01)
*H01L 51/50* (2006.01)

(52) U.S. Cl.
CPC ........ *H01L 51/008* (2013.01); *H01L 51/0052* (2013.01); *H01L 51/0055* (2013.01); *H01L 51/0067* (2013.01); *H01L 51/0071* (2013.01); *H01L 51/0072* (2013.01); *H01L 51/5004* (2013.01); *H01L 51/5012* (2013.01); *H01L 51/5072* (2013.01); *H01L 51/5092* (2013.01); *H01L 2251/55* (2013.01); *H01L 2251/554* (2013.01)

(58) Field of Classification Search
CPC ............... H01L 51/008; H01L 51/5004; H01L 51/0052; H01L 51/0055; H01L 51/0071; H01L 51/0067; H01L 51/0072; H01L 51/5012; H01L 51/5072; H01L 51/5092; H01L 2251/55; H01L 2251/554
See application file for complete search history.

(56) References Cited

U.S. PATENT DOCUMENTS

| | | | |
|---|---|---|---|
| 2004/0197601 A1 | 10/2004 | Thompson et al. | |
| 2005/0211958 A1* | 9/2005 | Conley | H05B 33/14 252/583 |
| 2014/0361286 A1* | 12/2014 | Jaeger | H01L 51/5088 257/40 |
| 2017/0331067 A1* | 11/2017 | Park | C09K 11/06 |
| 2018/0261784 A1* | 9/2018 | Wallikewitz | H01L 51/5096 |

FOREIGN PATENT DOCUMENTS

JP 2003-338377 A 11/2003

OTHER PUBLICATIONS

PCT International Search Report and Written Opinion for PCT Application No. PCT/EP2016/072955 dated Nov. 30, 2016 (10 pages).
European Search Report for EP Application No. 16185999.6 dated Feb. 24, 2017 (6 pages).
Kim et al., "Improvement of Mixed Electron Transport Structure Red Phosphorescent Organic Light-Emitting Diode," Mol. Cryst. Liq. Cryst., 2011, 538:53-60.

* cited by examiner

Primary Examiner — Robert S Jones, Jr.
(74) Attorney, Agent, or Firm — Eversheds Sutherland (US) LLP

(57) ABSTRACT

The present invention relates to an organic electroluminescent device comprising an anode, a cathode, an emission layer, an undoped electron transport layer comprising a first matrix compound, and an electron injection layer comprising a second matrix compound and an alkali organic complex and/or alkali halide, wherein the undoped electron transport layer and the electron injection layer are arranged between the emission layer and the cathode, wherein the reduction potential of the first matrix compound is less negative than, the reduction potential of 9,10-di(naphthalen-2-yl)anthracene and more negative than the reduction potential of 4,4'-bis(4,6-diphenyl-1,3,5-triazin-2-yl)biphenyl, wherein the reduction potential in both cases is measured against $Fc/Fc^+$ in tetrahydrofurane; and the dipole moment of the first matrix compound is selected $\geq 0$ Debye and $\leq 2.5$ Debye and the dipole moment of the second matrix compound is selected $>2.5$ and $<10$ Debye.

15 Claims, 2 Drawing Sheets

ORGANIC ELECTROLUMINESCENT DEVICE

CROSS REFERENCE TO RELATED APPLICATIONS

This application is a U.S. national stage application of PCT/EP2016/072955, filed Sep. 27, 2016, which claims priority to European Application Nos. 15187146.4 and 16185999.6, filed Sep. 28, 2015 and Aug. 26, 2016, respectively. The contents of these applications are incorporated herein by reference.

The present invention relates to an organic electroluminescent device.

DESCRIPTION OF THE RELATED ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

JP 2003-338377 discloses the benefit of a non-polar electron transport layer (ETL), for example anthracene derivatives and a polar undoped electron injection layer (EIL), for example phenanthroline. Polarity is characterized through the dipole moment (<2 Debye for the ETL, >2 Debye for the EIL).

To improve electron injection further, EILs doped with Li organic complexes have been developed, in particular benzimidazole-based matrix compound doped with LiQ, phenanthroline-based matrix compound doped with LiQ or phosphine oxide-based matrix compound doped with Li organic complex.

US2007252521 teaches that the LUMO off-set between the emission layer and ETL should be selected as small as possible. Ideally, no LUMO off-set between the EML and ETL should be present.

However, the power efficiency of organic electroluminescent devices still remains to be improved. The power efficiency is of particular importance for commercial products as it takes into account the human eye response. The higher the power efficiency, the more effectively power is converted into light output that is visible to the human eye.

SUMMARY

Therefore, it is the object of the present invention to provide organic electroluminescent devices overcoming drawbacks of the prior art, in particular featuring increased power efficiency measured in lumen per Watt (lm/W), in particular of fluorescent blue devices, such as OLEDs.

According to one aspect, there is provided an organic electroluminescent device comprising an anode, a cathode, an emission layer, an undoped electron transport layer comprising a first matrix compound, and an electron injection layer comprising a second matrix compound and an alkali organic complex and/or alkali halide, wherein the undoped electron transport layer and the electron injection layer are arranged between the emission layer and the cathode, wherein the reduction potential of the first matrix compound is less negative than the reduction potential of 9,10-di(naphthalen-2-yl)anthracene (CAS 122648-99-1) and more negative than the reduction potential of 4,4'-bis(4,6-diphenyl-1,3,5-triazin-2-yl)biphenyl (CAS 266349-83-1), wherein the reduction potential in both cases is measured against $Fc/Fc^+$ in tetrahydrofurane; and the dipole moment of the first matrix compound is selected $\geq 0$ Debye and $\leq 2.5$ Debye and the dipole moment of the second matrix compound is selected $>2.5$ and $<10$ Debye.

In a preferred embodiment, the undoped electron transport layer is adjacent to the emission layer, the electron injection layer is adjacent to the undoped electron transport layer and the cathode is adjacent to the electron injection layer.

In a further embodiment, there is provided an organic electroluminescent device comprising an anode, a cathode, an emission layer, an undoped electron transport layer comprising a first matrix compound, and an electron injection layer comprising a second matrix compound and an alkali organic complex and/or alkali halide, wherein the undoped electron transport layer and the electron injection layer are arranged between the emission layer and the cathode, and wherein the reduction potential of the first matrix compound is less negative than the reduction potential of 9,10-di(naphthalen-2-yl)anthracene and more negative than the reduction potential of 4,4'-bis(4,6-diphenyl-1,3,5-triazin-2-yl)biphenyl, wherein the reduction potential in both cases is measured against $Fc/Fc^+$ in tetrahydrofurane; and the dipole moment of the first matrix compound is selected $\geq 0$ Debye and $\leq 2.5$ Debye and the dipole moment of the second matrix compound is selected $>2.5$ and $<10$ Debye; and the emission layer is in direct contact with the undoped electron transport layer; and wherein the emission layer comprises an EML host; and wherein the off-set between the reduction potential of the EML host and the reduction potential of the first matrix compound is selected $\geq 0.05$ and $\leq 0.35$ V, preferably $\geq 0.1$ and $\leq 0.3$ V.

The EML host, also named emission layer host, emitter host or host, is the host material comprised in the emission layer. The EML host is an essentially non-emissive compound.

In the context of the present specification the term "essentially non-emissive" means that the contribution of the compound or layer to the visible emission spectrum from the device is less than 10%, preferably less than 5% relative to the visible emission spectrum. The visible emission spectrum is an emission spectrum with a wavelength of about $\geq 380$ nm to about $\leq 780$ nm.

Preferably, the emission layer further comprises a fluorescent blue emitter.

The off-set in reduction potential is calculated by subtracting the reduction potential of the EML host from the reduction potential of the first matrix compound. When the reduction potential of the EML host is more negative than the reduction potential of the first matrix compound, the off-set is $>0$. After extensive studies, it was surprisingly found that (a) a small off-set in LUMO level between the emission layer (EML) and ETL is beneficial for lm/W efficiency and (b) too large an off-set should be avoided as the lm/W efficiency drops off due to a significant decrease in external quantum efficiency EQE.

To exemplify the invention, reference is made to FIG. 1, showing some materials according to the invention and of the prior art, wherein the power efficiency in lm/W is shown against (a) off-set in reduction potential between the emission layer (EML) host and first matrix compound (ETL matrix) (primary x-axis) and (b) reduction potential of first matrix compound measured against Fc/Fc$^+$ in tetrahydrofurane (secondary x-axis).

In a further embodiment, there is provided an organic electroluminescent device comprising an anode, a cathode, an emission layer, an undoped electron transport layer comprising a first matrix compound, and an electron injection layer comprising a second matrix compound and an alkali organic complex and/or alkali halide, wherein the undoped electron transport layer and the electron injection layer are arranged between the emission layer and the cathode, and wherein the reduction potential of the first matrix compound is less negative than the reduction potential of 9,10-di(naphthalen-2-yl)anthracene and more negative than the reduction potential of 4,4'-bis(4,6-diphenyl-1,3,5-triazin-2-yl)biphenyl, wherein the reduction potential in both cases is measured against Fc/Fc$^+$ in tetrahydrofurane; and
the dipole moment of the first matrix compound is selected ≥0 Debye and ≤2.5 Debye and the dipole moment of the second matrix compound is selected >2.5 and <10 Debye; and
the emission layer is in direct contact with the undoped electron transport layer; and
wherein the emission layer comprises an EML host; and
wherein the reduction potential of the first matrix compound is selected between 0.05 and 0.35 V less negative than the reduction potential of the EML host, when measured under the same conditions.

If the reduction potential of the EML host is selected in this range, particularly good performance may be achieved.

In a further embodiment, there is provided an organic electroluminescent device comprising an anode, a cathode, an emission layer, an undoped electron transport layer comprising a first matrix compound, and an electron injection layer comprising a second matrix compound and an alkali organic complex and/or alkali halide, wherein the undoped electron transport layer and the electron injection layer are arranged between the emission layer and the cathode, and
wherein the LUMO of the first matrix compound is more negative than the LUMO of 9,10-di(naphthalen-2-yl)anthracene and less negative than the LUMO of 4,4'-bis(4,6-diphenyl-1,3,5-triazin-2-yl)biphenyl, wherein the LUMO is determined under the same conditions; and
and the dipole moment of the first matrix compound is selected ≥0 Debye and ≤2.5 Debye and the dipole moment of the second matrix compound is selected >2.5 and <10 Debye; and
the emission layer is in direct contact with the undoped electron transport layer; and
wherein the emission layer comprises an EML host; and
wherein the LUMO of the first matrix compound is selected between 0.02 and 0.4 eV more negative than the LUMO of the EML host, when determined under the same conditions.

If the LUMO of the first matrix compound is selected in this range, particularly good performance may be achieved.

The undoped electron transport layer (ETL) comprises a first matrix compound. The first matrix compound is also described as ETL matrix compound. It is an essentially non-emissive compound.

The undoped ETL is substantially free of an alkali organic complex or alkali halide.

"Substantially free" in this regard means that no alkali organic complex or alkali halide is present in the undoped ETL besides unavoidable impurities. Unavoidable impurities are such impurities which cannot be avoided by a person skilled in the art when carefully preparing the inventive devices. For example it is well known that due to diffusion or other similar processes compounds comprised in a layer can get into an adjacent layer during preparing, storing or applying an electronic device. This results in unavoidable impurities.

First Matrix Compound

The dipole moment of the first matrix compound is selected ≥0 Debye and ≤2.5 Debye, preferably ≥0 Debye and <2.3 Debye, more preferably ≥0 Debye and <2 Debye.

When the dipole moment of the first matrix compound is selected ≥0 Debye and ≤2.5 Debye, the first matrix compound can also be described as non-polar matrix compound.

The dipole moment $|\vec{\mu}|$ of a molecule containing N atoms is given by:

$$\vec{\mu} = \sum_i^N q_i \vec{r}_i$$

$$|\vec{\mu}| = \sqrt{\mu_x^2 + \mu_y^2 + \mu_z^2}$$

where $q_i$ and $\vec{r}_i$ are the partial charge and position of atom i in the molecule.

The dipole moment is determined by a semi-empirical molecular orbital method.

The values in Table 4 and 5 were calculated using the method as described below.

The partial charges and atomic positions are obtained using either the DFT functional of Becke and Perdew BP with a def-SV(P) basis or the hybrid functional B3LYP with a def2-TZVP basis set as implemented in the program package TURBOMOLE V6.5. If more than one conformation is viable, the conformation with the lowest total energy is selected to determine the dipole moment.

When a matrix compound has a dipole moment between 0 and 2.5 Debye, the matrix compound may contain a center of inversion I, a horizontal mirror plane, more than one $C_n$ axis (n>1), and/or n $C_2$ perpendicular to $C_n$.

If a matrix compound has a dipole moment between 0 and 2.5 Debye, the matrix compound may contain a dibenzo[c,h]acridine group, a dibenzo[a,j]acridine group, a benzo[c]acridine group, a triaryl borane group, a 2-(benzo[d]oxazol-2-yl)phenoxy metal complex, a 2-(benzo[d]thiazol-2-yl)phenoxy metal complex, a triazine group, a benzothienopyrimidine group or a benzo[k]fluoranthene group.

If a matrix compounds has a dipole moment between 0 and 2.5 Debye, the matrix compound is free of an imidazole group, a phenanthroline group, a phosphine oxide group, an oxadiazole group, a triazole group, a pyrimidine group, a quinazoline group, a benzo[h]quinazoline group or a pyrido[3,2-h]quinazoline group.

According to another aspect, there is provided an organic electroluminescent device comprising an anode, a cathode, an emission layer, an undoped electron transport layer comprising a first matrix compound, and an electron injection layer comprising a second matrix compound and an alkali organic complex and/or alkali halide,
wherein the undoped electron transport layer and the electron injection layer are arranged between the emission layer and the cathode,
wherein the reduction potential of the first matrix compound is less negative than −2.44 V and more negative than −2.03 V, wherein the reduction potential in both cases is measured against Fc/Fc⁺ in tetrahydrofurane; and
the dipole moment of the first matrix compound is selected ≥0 Debye and ≤2.5 Debye and the dipole moment of the second matrix compound is selected >2.5 and <10 Debye.

Preferably, the reduction potential of the first matrix compound is selected between −2.4 and −2.1 V, even more preferred between −2.34 and −2.14 V.

The reduction potential is determined by cyclic voltammetry with potenioststic device Metrohm PGSTAT30 and software Metrohm Autolab GPES at room temperature. The redox potentials given at particular compounds were measured in an argon de-aerated, dry 0.1M THF solution of the tested substance, under argon atmosphere, with 0.1M tetrabutylammonium hexafluorophosphate supporting electrolyte, between platinum working electrodes and with an Ag/AgCl pseudo-standard electrode (Metrohm Silver rod electrode), consisting of a silver wire covered by silver chloride and immersed directly in the measured solution, with the scan rate 100 mV/s. The first run was done in the broadest range of the potential set on the working electrodes, and the range was then adjusted within subsequent runs appropriately. The final three runs were done with the addition of ferrocene (in 0.1M concentration) as the standard. The average of potentials corresponding to cathodic and anodic peak of the studied compound, after subtraction of the average of cathodic and anodic potentials observed for the standard Fc⁺/Fc redox couple, afforded finally the values reported above. All studied compounds as well as the reported comparative compounds showed well-defined reversible electrochemical behaviour.

Under these conditions, the redox potential of 9,10-di(naphthalen-2-yl)anthracene is −2.44 V and the reduction potential of 4,4'-bis(4,6-diphenyl-1,3,5-triazin-2-yl)biphenyl is −2.03 V.

In another embodiment, the reduction potential of the first matrix compound is more negative than −2.03 V and less negative than −2.44 V, preferably more negative than −2.1 V and less negative than −2.4 V, even more preferred more negative than −2.15 V and less negative than −2.35 V.

A simple rule is very often used for the conversion of redox potentials into electron affinities and ionization potential: IP (in eV)=4.84 eV+e*Eox (wherein Eox is given in Volt vs. ferrocene/ferrocenium (Fc/Fc+) and EA (in eV)=4.84 eV+e*Ered (Ered is given in Volt vs. Fc/Fc+) respectively (see B. W. D'Andrade, Org. Electron. 6, 11-20 (2005)), e* is the elemental charge. It is common practice, even if not exactly correct, to use the terms "energy of the HOMO" E(HOMO) and "energy of the LUMO" E(LUMO), respectively, as synonyms for the ionization energy and electron affinity (Koopmans Theorem).

According to another aspect, there is provided an organic electroluminescent device comprising an anode, a cathode, an emission layer, an undoped electron transport layer comprising a first matrix compound, and an electron injection layer comprising a second matrix compound and an alkali organic complex and/or alkali halide,
wherein the undoped electron transport layer and the electron injection layer are arranged between the emission layer and the cathode,
wherein the LUMO level of the first matrix compound is more negative than the LUMO level of 9,10-di(naphthalen-2-yl)anthracene (CAS 122648-99-1) and less negative than the LUMO level of 4,4'-bis(4,6-diphenyl-1,3,5-triazin-2-yl)biphenyl (CAS 266349-83-1) when determined under the same conditions; and
the dipole moment of the first matrix compound is selected ≥0 Debye and ≤2.5 Debye and the dipole moment of the second matrix compound is selected >2.5 and <10 Debye.

Applying Koopmans Theorem, the LUMO level of 9,10-di(naphthalen-2-yl)anthracene has been determined as −2.36 eV and the LUMO level of 4,4'-bis(4,6-diphenyl-1,3,5-triazin-2-yl)biphenyl is at −2.77 eV.

In another embodiment, the LUMO level of the first matrix compound is more negative than −2.36 eV and less negative than −2.77 eV, preferably more negative than −2.4 eV and less negative than −2.7 eV, even more preferred, more negative than −2.35 eV and less negative than −2.65 eV, also preferred more negative than −2.4 eV and less negative than −2.65 eV.

In a preferred embodiment, the first matrix compound is selected from the following compounds or derivatives thereof, the compounds being dibenzo[c,h]acridine, dibenzo[a,j]acridine, benzo[c]acridine, triaryl borane compounds, 2-(benzo[d]oxazol-2-yl)phenoxy metal complex; 2-(benzo[d]thiazol-2-yl)phenoxy metal complex, triazine, benzothienopyrimidine, benzo[k]fluoranthene, perylene or mixtures thereof.

It may be further preferred that the first matrix compound comprises a triaryl borane compound of formula (I)

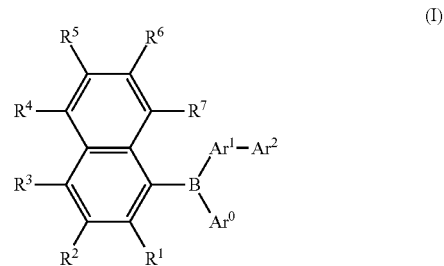

wherein $R^1$, $R^3$ and $R^7$ are independently selected from a group consisting of H, D, $C_1$-$C_{16}$ alkyl and $C_1$-$C_{16}$ alkoxy; $R^2$, $R^4$, $R^5$ and $R^6$ are independently selected from a group consisting of H, D, $C_1$-$C_{16}$ alkyl, $C_1$-$C_{16}$ alkoxy and $C_6$-$C_{20}$ aryl;
$Ar^0$ is selected from substituted or unsubstituted $C_6$-$C_{20}$ aryl, wherein, in case that $Ar^0$ is substituted, the substituents are independently selected from a group consisting of D, $C_1$-$C_{12}$ alkyl, $C_1$-$C_{16}$ alkoxy and $C_6$-$C_{20}$ aryl; and
$Ar^1$ is selected from substituted or unsubstituted $C_6$-$C_{20}$ arylene, wherein, in case that $Ar^1$ is substituted, the substituents are independently selected from a group consisting of D, $C_1$-$C_{12}$ alkyl, $C_1$-$C_{16}$ alkoxy and $C_6$-$C_{20}$ aryl; and
$Ar^2$ is selected from $Ar^2$ is selected from a group consisting of H, D, substituted or unsubstituted $C_6$-$C_{40}$ aryl and $C_5$-$C_{40}$ heteroaryl.

Preferably, $Ar^0$ is selected from substituted or unsubstituted phenyl or napthyl, wherein, in case that $Ar^0$ is substituted, the substituents are independently selected from a group consisting of D, $C_1$-$C_{12}$ alkyl, $C_1$-$C_6$ alkoxy and $C_6$-$C_{20}$ aryl.

It may be further preferred that the first matrix compound comprises a triaryl borane compound of formula (Ia)

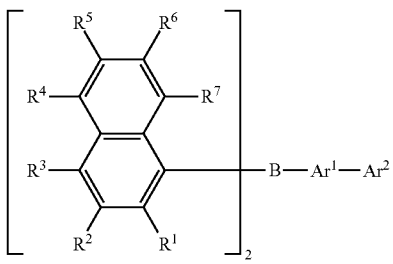

(Ia)

wherein $R^1$, $R^3$ and $R^7$ are independently selected from a group consisting of H, D, $C_1$-$C_{16}$ alkyl and $C_1$-$C_{16}$ alkoxy; $R^2$, $R^4$, $R^5$ and $R^6$ are independently selected from a group consisting of H, D, $C_1$-$C_{16}$ alkyl, $C_1$-$C_{16}$ alkoxy and $C_6$-$C_{20}$ aryl;

$Ar^1$ is selected from substituted or unsubstituted $C_6$-$C_{20}$ arylene, wherein, in case that $Ar^1$ is substituted, the substituents are independently selected from a group consisting of D, $C_1$-$C_{12}$ alkyl, $C_1$-$C_{16}$ alkoxy and $C_6$-$C_{20}$ aryl; and $Ar^2$ is selected from a group consisting of H, D, substituted or unsubstituted $C_6$-$C_{40}$ aryl and groups of the following formulas (IIa) to (IIh), wherein * marks the position in the respective $Ar^2$ group for binding the $Ar^2$ to the $Ar^1$ group,

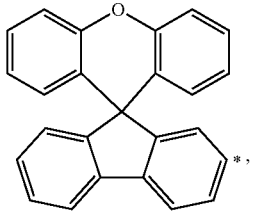

(IIa)

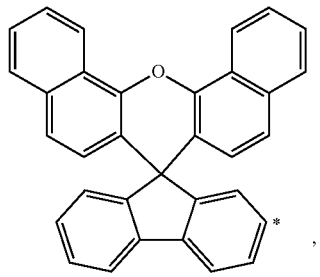

(IIb)

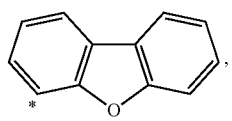

(IIc)

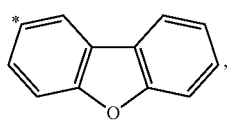

(IId)

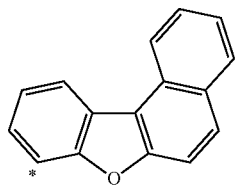

(IIe)

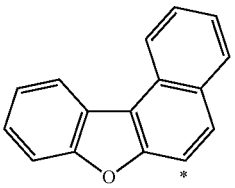

(IIf)

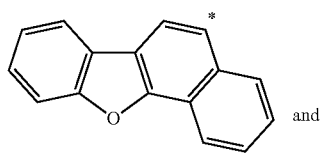

(IIg)

and

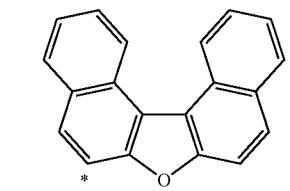

(IIh)

wherein in case that $Ar^2$ is substituted, the substituents are independently selected from a group consisting of D, halide, $C_1$-$C_{16}$ alkyl, $C_1$-$C_{16}$ alkoxy, and $C_6$-$C_{20}$ aryl, preferably naphthyl, 9-fluorenyl, 2-fluorenyl, 3-fluorenyl and 4-fluorenyl, wherein the $C_6$-$C_{10}$ aryl may be unsubstituted or substituted with $C_1$-$C_{16}$ alkyl, $C_1$-$C_1$ heteroalkyl and $C_6$-$C_{40}$ aryl;

wherein $Ar^1$ and $Ar^2$ may be further linked via a methylene (—$CR^8R^9$—) or an oxy (—O—) moiety to form a fluorene or dibenzofuran structure, wherein $R^1$ and $R^9$ may be independently selected from H, $C_1$-$C_{16}$ alkyl and $C_1$-$C_{16}$ alkoxy and $C_6$-$C_{20}$ aryl.

In another aspect, $Ar^2$ is selected from the group consisting of phenyl, naphthyl, anthranyl, phenanthryl, pyrenyl, 9-fluorenyl, 2-fluorenyl, 3-fluorenyl, 4-fluorenyl, 5-fluorenyl and formula (IIa) to (IIh).

In another aspect, $R^1$ is preferably $C_1$-$C_{12}$ alkyl, more preferred methyl, or $C_1$-$C_{12}$ alkoxy, more preferred methoxy, and $R^2$ to $R^7$ are each H.

In another aspect, $Ar^1$ is preferably phenyl, biphenyl, naphthyl, phenanthryl or anthranyl.

The triaryl borane compounds of formula (Ia) have not yet been described for use in electroluminescent devices, such as that of the invention.

In a further preferred embodiment, the first matrix compound comprises a dibenzo[c,h]acridine compound of formula (II)

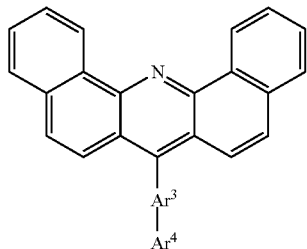

(II)

and/or a dibenzo[a,j]acridine compound of formula (I) III

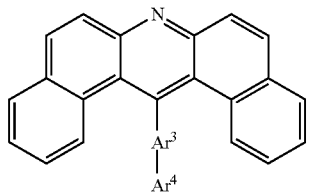

(III)

and/or a benzo[c]acridine compound of formula (IV)

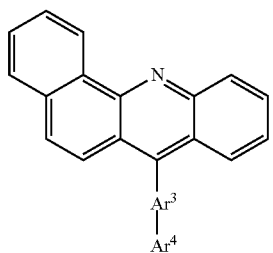

(IV)

wherein $Ar^3$ is independently selected from $C_6$-$C_{20}$ arylene, preferably phenylene, biphenylene, or fluorenylene;
$Ar^4$ is independently selected from unsubstituted or substituted $C_6$-$C_{40}$ aryl, preferably phenyl, naphthyl, anthranyl, pyrenyl, or phenanthryl;
and in case that $Ar^4$ is substituted, the one or more substituents may be independently selected from the group consisting of $C_1$-$C_{12}$ alkyl and $C_1$-$C_{12}$ heteroalkyl, wherein $C_1$-$C_5$ alkyl is preferred.

Suitable dibenzo[c,h]acridine compounds are disclosed in EP 2 395 571 and incorporated by reference. Suitable dibenzo[a,j]acridine are disclosed in EP 2 312 663 and incorporated by reference. Suitable benzo[c]acridine compounds are disclosed in WO 2015/083948 and incorporated by reference.

In a further embodiment, it is preferred that the first matrix compound comprises a dibenzo[c,h]acridine compound substituted with $C_6$-$C_{40}$ aryl, $C_5$-$C_{40}$ heteroaryl and/or $C_1$-$C_{12}$ alkyl groups, preferably 7-naphthalen-2-yl)dibenzo[c,h]acridine, 7-(3-(pyren-1-yl)phenyl)dibenzo[c,h]acridine, 7-(3-(pyridin-4-yl)phenyl)dibenzo[c,h]acridine.

In a further embodiment, it is preferred that the first matrix compound comprises a dibenzo[a,j]acridine compound substituted with $C_6$-$C_{40}$ aryl, $C_5$-$C_{40}$ heteroaryl and/or $C_1$-$C_{12}$ alkyl groups, preferably 14-(3-(pyren-1-yl)phenyl)dibenzo[a,j]acridine.

In a further embodiment, it is preferred that the first matrix compound comprises a benzo[c]acridine compound substituted with $C_6$-$C_{40}$ aryl, $C_5$-$C_{40}$ heteroaryl and/or $C_1$-$C_{12}$ alkyl groups, preferably 7-(3-(pyren-1-yl)phenyl)benzo[c]acridine.

It may be further preferred that the first matrix compound comprises a triazine compound of formula (V)

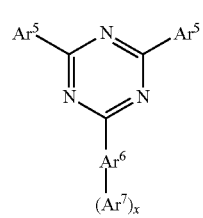

(V)

wherein $Ar^5$ is independently selected from unsubstituted or substituted $C_6$-$C_{20}$ aryl or $Ar^{5.1}$-$Ar^{5.2}$,
wherein $Ar^{5.1}$ is selected from unsubstituted or substituted $C_6$-$C_{20}$ arylene and
$Ar^{5.2}$ is selected from unsubstituted or substituted $C_6$-$C_{20}$ aryl or unsubstituted and substituted $C_5$-$C_{20}$ heteroaryl;
$Ar^6$ is selected from unsubstituted or substituted $C_6$-$C_{20}$ arylene, preferably phenylene, biphenylene, terphenylene, fluorenylene;
$Ar^7$ is independently selected from a group consisting of substituted or unsubstituted aryl, substituted or unsubstituted heteroaryl, the aryl and the heteroaryl having 6 to 40 ring-forming atoms, preferably phenyl, naphthyl, phenantryl, fluorenyl, terphenyl, pyridyl, quinolyl, pyrimidyl, triazinyl, benzo[h]quinolinyl, or benzo[4,5]thieno[3,2-d]pyrimidine;
x is selected from 1 or 2,
wherein in case that $Ar^5$ is substituted the one or more substituents may independently be selected from $C_1$-$C_{12}$ alkyl and $C_1$-$C_{12}$ heteroalkyl, preferably $C_1$-$C_5$ alkyl;
and in case that $Ar^7$ is substituted, the one or more substituents may be independently selected from $C_1$-$C_{12}$ alkyl and $C_1$-$C_{12}$ heteroalkyl, preferably $C_1$-$C_5$ alkyl, and from $C_6$-$C_{20}$ aryl.

Suitable triazine compounds are disclosed in US 2011/284832, WO 2014/171541, WO 2015/008866, WO2015/105313, JP 2015-074649 A, and JP 2015-126140, KR 2015/0088712 and incorporated by reference.

Furthermore, it is preferred that the first matrix compound comprises a triazine compound substituted with $C_6$-$C_{40}$ aryl, $C_5$-$C_{40}$ heteroaryl and/or $C_1$-$C_2$ alkyl groups, preferably 3-[4-(4,6-di-2-naphthalenyl-1,3,5-triazin-2-yl)phenyl]quinolone, 2-[3-(6'-methyl[2,2'-bipyridin]-5-yl)-5-(9-phenanthrenyl)phenyl]-4,6-diphenyl-1,3,5-triazine, 2-(3-(phenanthren-9-yl)-5-(pyridin-2-yl)phenyl)-4,6-diphenyl-1,3,5-triazine, 2,4-diphenyl-6-(5'''-phenyl-[1,1':3',1'':3'',1''':3''',1''''-quinquephenyl]-3-yl)-1,3,5-triazine, 2-([1,1'-biphenyl]-3-yl)-4-(3'-(4,6-diphenyl-1,3,5-triazin-2-yl)-[1,1'-biphenyl]-3-yl)-6-phenyl-1,3,5-triazine and/or 2-(3'-(4,6-diphenyl-1,3,5-triazin-2-yl)-[1,1'-biphenyl]-3-yl)-4-phenylbenzo[4,5]thieno[3,2-d]pyrimidine.

In a further preferred embodiment, the first matrix compound comprises a 2-(benzo[d]oxazol-2-yl)phenoxy metal complex or 2-(benzo[d]thiazol-2-yl)phenoxy metal complex of formula (VI)

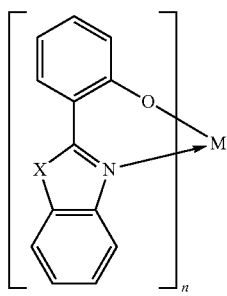

(VI)

wherein M is a metal selected from Al, Zr or Sc;
X is selected from O or S; and
n is selected from 3 or 4.

Suitable 2-(benzo[d]oxazol-2-yl)phenoxy metal complex or 2-(benzo[d]thiazol-2-yl)phenoxy metal complex are disclosed in WO 2010/020352 and incorporated by reference.

In a preferred embodiment, the 2-(benzo[d]oxazol-2-yl)phenoxy metal complex is selected from tris(2-(benzo[d]oxazole-2-yl)phenoxy)aluminum and tetra(2-(benzo[d]oxazole-2-yl)phenoxy)zirconium.

In a preferred embodiment, the 2-(benzo[d]thiazol-2-yl)phenoxy metal complex is selected from tris(2-(benzo[d]thiazol-2-yl)phenoxy)aluminum and tetra(2-(benzo[d]oxazole-2-yl)phenoxy)zirconium.

In a further preferred embodiment, the first matrix compound comprises a benzothienopyrimidine compound substituted with $C_6$-$C_{40}$ aryl, $C_5$-$C_{40}$ heteroaryl and/or $C_1$-$C_{12}$ alkyl groups, preferably 2-phenyl-4-(4',5',6'-triphenyl-[1,1':2',1'':3'',1'''-quaterphenyl]-3'''-yl)benzo[4,5]thieno[3,2-d]pyrimidine.

Suitable benzothienopyrimidine compounds are disclosed in W 2015/0105316 and incorporated by reference.

In a further preferred embodiment, the first matrix compound comprises a benzo[k]fluoranthene compound substituted with $C_6$-$C_{40}$ aryl, $C_5$-$C_{40}$ heteroaryl and/or $C_1$-$C_{12}$ alkyl groups, preferably 7,12-diphenylbenzo[k]fluoranthene.

Suitable benzo[k]fluoranthene compounds are disclosed in JP10189247 A2 and incorporated by reference.

In a further preferred embodiment, the first matrix compound comprises a perylene compound substituted with $C_6$-$C_{40}$ aryl, $C_5$-$C_{40}$ heteroaryl and/or $C_1$-$C_{12}$ alkyl groups, preferably 3,9-bis([1,1'-biphenyl]-2-yl)perylene, 3,9-di(naphthalene-2-yl)perylene or 3,10-di(naphthalene-2-yl)perylene.

Suitable perylene compounds are disclosed in US2007202354 and incorporated by reference.

The first matrix compound may preferably be selected from one of the following compounds of Table 1.

TABLE 1

| First matrix compounds which may be suitable used |
|---|
| Compound | Structure |
|---|---|
| ETM-1 | |
| ETM-2 | |

TABLE 1-continued
First matrix compounds which may be suitable used
| Compound | Structure |
|---|---|
| ETM-3 | 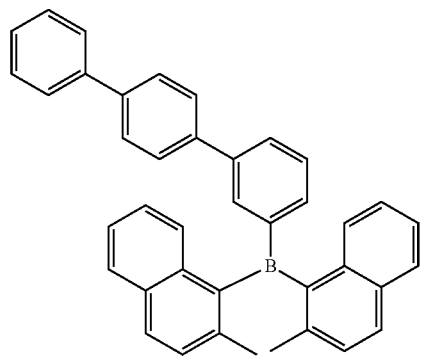 [SMILES: Cc1ccc2ccccc2c1B(c1cccc(-c2ccc(-c3ccccc3)cc2)c1)c1c(C)ccc2ccccc12] |
| ETM-4 | 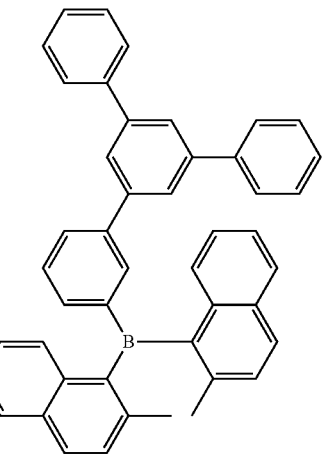 |
| ETM-5 | 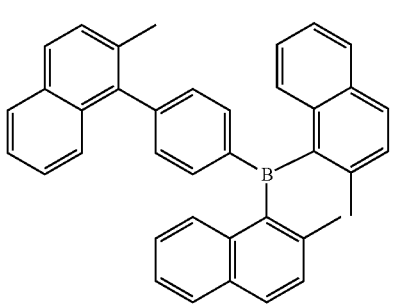 [SMILES: Cc1ccc2ccccc2c1B(c1ccc(-c2c(C)ccc3ccccc23)cc1)c1c(C)ccc2ccccc12] |
| ETM-6 | 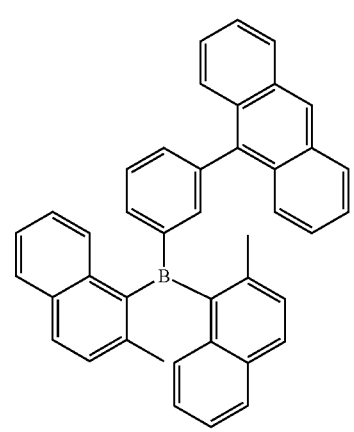 [SMILES: Cc1ccc2ccccc2c1B(c1cccc(-c2c3ccccc3cc3ccccc23)c1)c1c(C)ccc2ccccc12] |

TABLE 1-continued
First matrix compounds which may be suitable used
| Compound | Structure |
|---|---|
| ETM-7 | 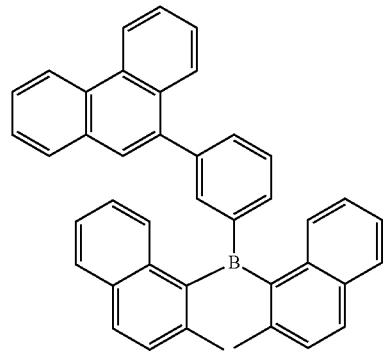 [SMILES: Cc1ccc2ccccc2c1B(c1cccc(-c2cc3ccccc3c3ccccc23)c1)c1c(C)ccc2ccccc12] |
| ETM-8 | 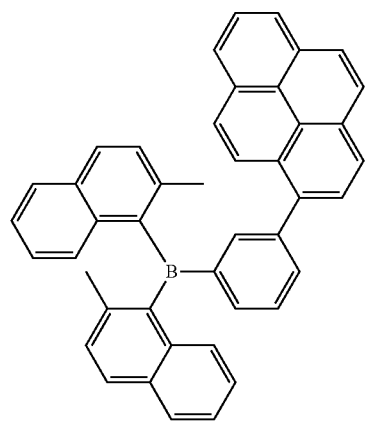 [SMILES: Cc1ccc2ccccc2c1B(c1cccc(-c2ccc3ccc4cccc5ccc2c3c45)c1)c1c(C)ccc2ccccc12] |
| ETM-9 | 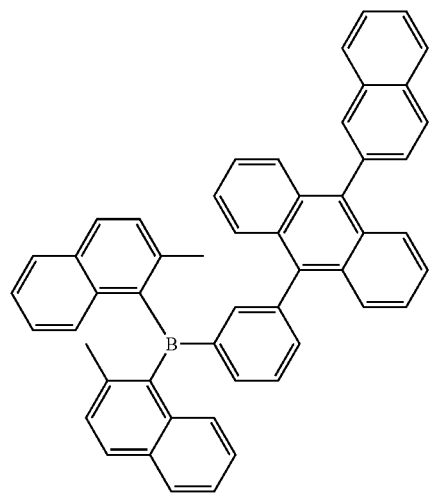 [SMILES: Cc1ccc2ccccc2c1B(c1cccc(-c2c3ccccc3c(-c3ccc4ccccc4c3)c3ccccc23)c1)c1c(C)ccc2ccccc12] |

TABLE 1-continued
| First matrix compounds which may be suitable used | |
|---|---|
| Compound | Structure |
| ETM-10 | 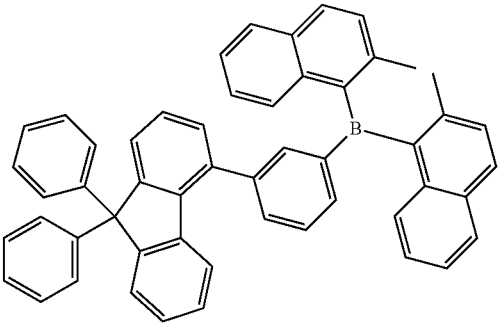 [SMILES: Cc1ccc2ccccc2c1B(c1cccc(-c2cccc3c2-c2ccccc2C3(c2ccccc2)c2ccccc2)c1)c1c(C)ccc2ccccc12] |
| ETM-11 | 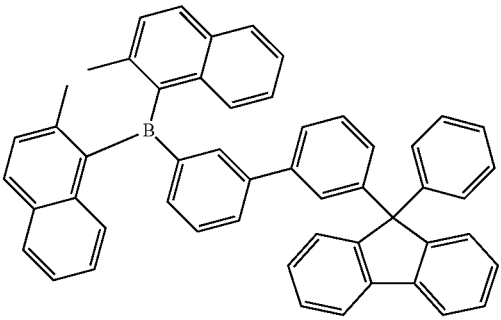 [SMILES: Cc1ccc2ccccc2c1B(c1cccc(-c2cccc(C3(c4ccccc4)c4ccccc4-c4ccccc43)c2)c1)c1c(C)ccc2ccccc12] |
| ETM-12 | 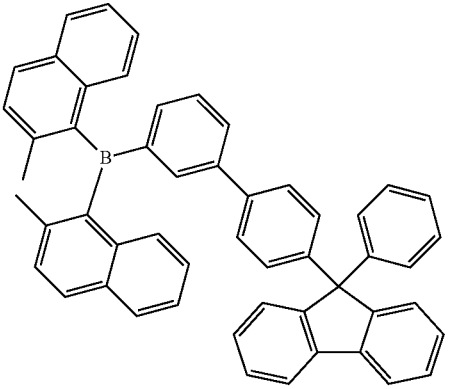 [SMILES: Cc1ccc2ccccc2c1B(c1cccc(-c2ccc(C3(c4ccccc4)c4ccccc4-c4ccccc43)cc2)c1)c1c(C)ccc2ccccc12] |
| ETM-13 | 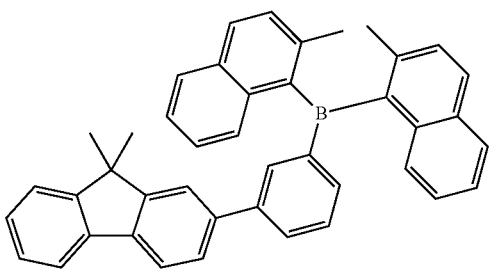 [SMILES: Cc1ccc2ccccc2c1B(c1cccc(-c2ccc3c(c2)C(C)(C)c2ccccc2-3)c1)c1c(C)ccc2ccccc12] |

TABLE 1-continued
First matrix compounds which may be suitable used
| Compound | Structure |
|---|---|
| ETM-14 | 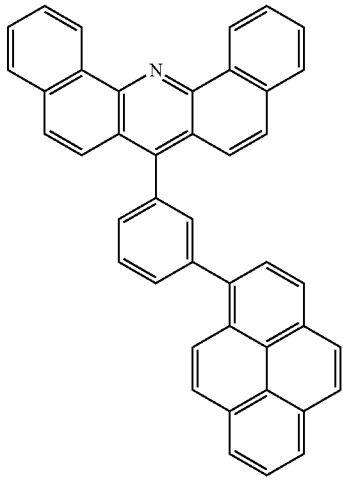 [SMILES: c1cc(-c2c3ccc4ccccc4c3nc3c2ccc2ccccc23)cc(-c2ccc3ccc4cccc5ccc2c3c45)c1] |
| ETM-15 | 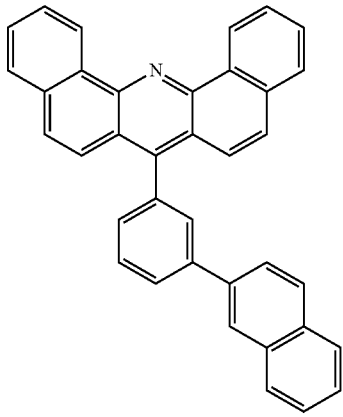 [SMILES: c1cc(-c2ccc3ccccc3c2)cc(-c2c3ccc4ccccc4c3nc3c2ccc2ccccc23)c1] |
| ETM-16 | 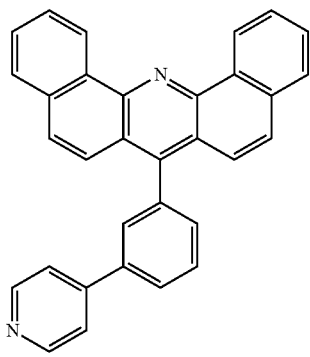 [SMILES: c1cc(-c2ccncc2)cc(-c2c3ccc4ccccc4c3nc3c2ccc2ccccc23)c1] |

TABLE 1-continued
First matrix compounds which may be suitable used
| Compound | Structure |
|---|---|
| ETM-17 | 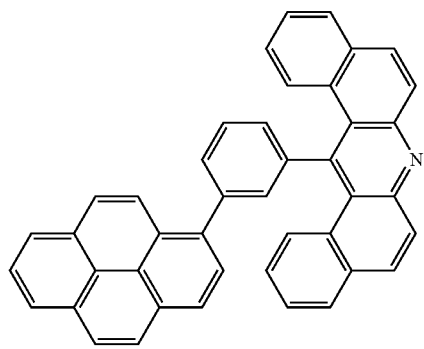 [SMILES: c1cc(-c2ccc3ccc4cccc5ccc2c3c45)cc(-c2c3c(ccc4ccccc43)nc3ccc4ccccc4c23)c1] |
| ETM-18 | 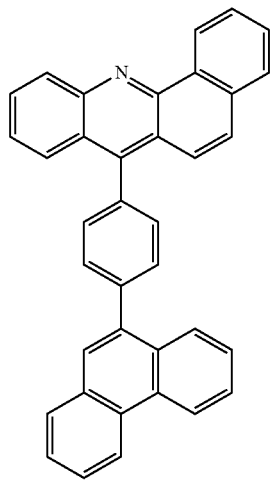 [SMILES: c1ccc2c(c1)cc(-c1ccc(-c3c4ccccc4nc4c3ccc3ccccc34)cc1)c1ccccc12] |
| ETM-19 | 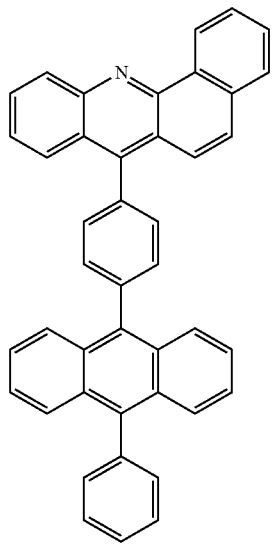 [SMILES: c1ccc(-c2c3ccccc3c(-c3ccc(-c4c5ccccc5nc5c4ccc4ccccc45)cc3)c3ccccc23)cc1] |

TABLE 1-continued
First matrix compounds which may be suitable used
| Compound | Structure |
|---|---|
| ETM-20 | 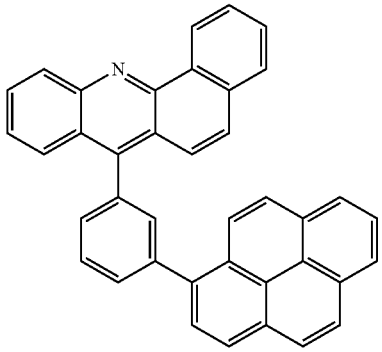 [SMILES: c1cc(-c2c3ccccc3nc3c2ccc2ccccc23)cc(-c2ccc3ccc4cccc5ccc2c3c45)c1] |
| ETM-21 | 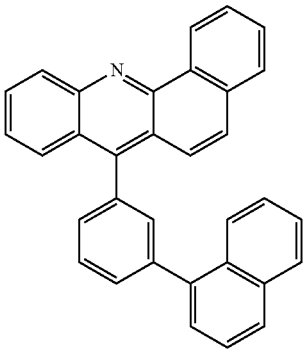 [SMILES: c1cc(-c2cccc3ccccc23)cc(-c2c3ccccc3nc3c2ccc2ccccc23)c1] |
| ETM-22 | 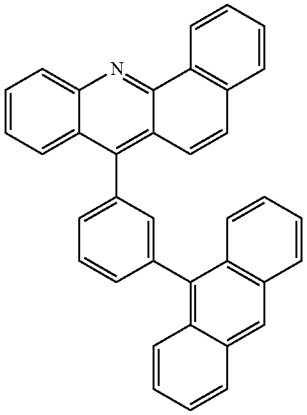 [SMILES: c1cc(-c2c3ccccc3cc3ccccc23)cc(-c2c3ccccc3nc3c2ccc2ccccc23)c1] |
| ETM-23 | 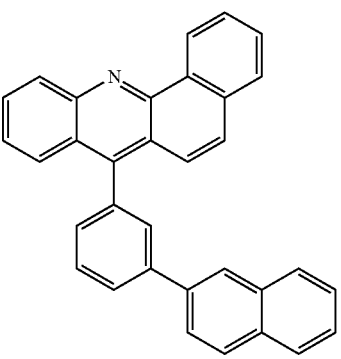 [SMILES: c1cc(-c2ccc3ccccc3c2)cc(-c2c3ccccc3nc3c2ccc2ccccc23)c1] |

TABLE 1-continued

First matrix compounds which may be suitable used

| Compound | Structure |
|---|---|
| ETM-24 | |
| ETM-25 | |
| ETM-26 | |
| ETM-27 | |

TABLE 1-continued

| First matrix compounds which may be suitable used | |
|---|---|
| Compound | Structure |
| ETM-28 | |
| ETM-29 | |
| ETM-30 | |

TABLE 1-continued
First matrix compounds which may be suitable used
| Compound | Structure |
| --- | --- |
| ETM-31 | 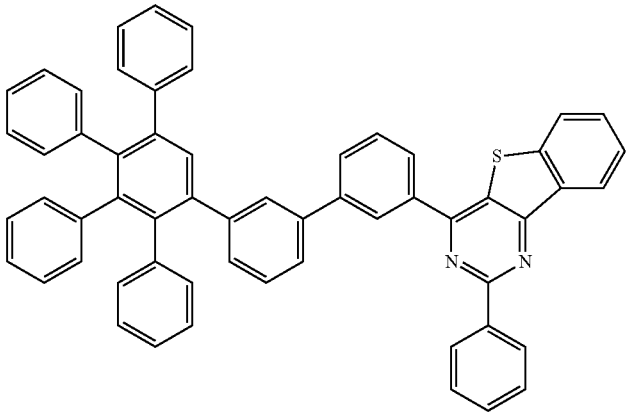 [SMILES: c1ccc(-c2nc(-c3cccc(-c4cccc(-c5cc(-c6ccccc6)c(-c6ccccc6)c(-c6ccccc6)c5-c5ccccc5)c4)c3)c3sc4ccccc4c3n2)cc1] |
| ETM-32 | 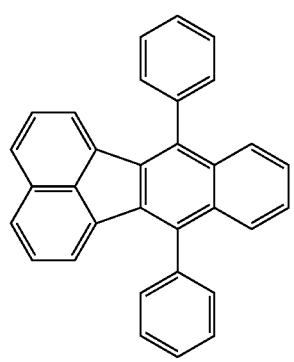 [SMILES: c1ccc(-c2c3c(c(-c4ccccc4)c4ccccc24)-c2cccc4cccc-3c24)cc1] |
| ETM-33 | 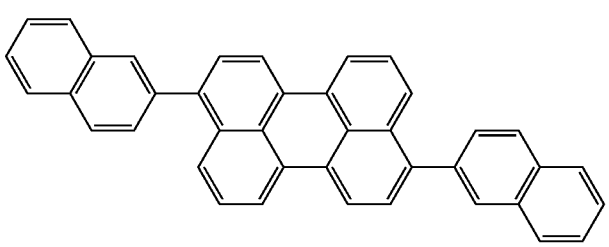 [SMILES: c1ccc2cc(-c3ccc4c5cccc6c(-c7ccc8ccccc8c7)ccc(c7cccc3c74)c65)ccc2c1] |
| ETM-34 | 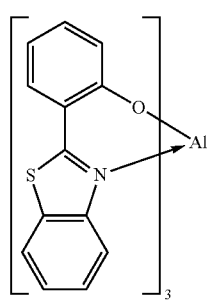 |

TABLE 1-continued

First matrix compounds which may be suitable used

| Compound | Structure |
|---|---|
| ETM-35 | [Zr complex with benzothiazole-phenoxide ligands, 4 ligands coordinated to Zr] |

Second Matrix Compound

The electron injection layer (EIL) comprises a second matrix compound and an alkali organic complex and/or alkali halide.

The second matrix compound is also described as EIL matrix compound. It is an essentially non-emissive compound.

The dipole moment of the second matrix compound is selected >2.5 Debye and <10 Debye, preferably >3 and <5 Debye, even more preferred >2.5 and less than 4 Debye.

When the dipole moment of the second matrix compound is selected >2.5 Debye and <10 Debye, the second matrix compound can also be described as polar matrix compound.

The dipole moment is calculated using the method described for the first matrix compound.

If a matrix compounds has a dipole moment >2.5 and <10 Debye, the matrix compound may be described by one of the following symmetry groups: $C_1$, $C_n$, $C_{nv}$, or $C_s$.

When a matrix compound has a dipole moment >2.5 and <10 Debye, the matrix compound may contain an imidazole group, a phenanthroline group, a phosphine oxide group, an oxadiazole group, a triazole group, a pyrimidine group, a quinazoline group, a benzo[h]quinazoline group or a pyrido[3,2-h]quinazoline group.

In further preferred embodiments, the second matrix compound is selected from the following compounds or derivatives thereof, the compounds being phosphine oxide, benzimidazole, phenanthroline, quinazoline, benzo[h]quinazoline and pyrido[3,2-h]quinazoline or mixtures thereof.

It is further preferred that the second matrix compound comprises a phosphine oxide compound substituted with $C_6$-$C_{40}$ aryl, $C_5$-$C_{40}$ heteroaryl and/or $C_1$-$C_{12}$ alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepin-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl) phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

It is further preferred that the second matrix compound comprises a phosphine oxide compound comprising a phosphepine ring, preferably 3-phenyl-3H-benzo[b]dinaphtho[2,1-d:1',2'-f]phosphepine-3-oxide.

Diphenylphosphine oxide compounds that can be used as second matrix materials are disclosed in EP 2395571 A1, WO2013079217 A1, EP 13187905, EP13199361 and JP2002063989 A1, incorporated by reference.

It is further preferred that the second matrix compound comprises a benzimidazole compound substituted with $C_6$-$C_{40}$ aryl, $C_5$-$C_{40}$ heteroaryl and/or $C_1$-$C_{12}$ alkyl groups, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole, and/or 1,3,5-tris(1-phenyl-1H-benzimidazol-2-yl)benzene.

Benzimidazole compounds that can be used as second matrix materials are disclosed in U.S. Pat. No. 6,878,469 and WO02010134352 and incorporated by reference.

Preferably, the second matrix compound comprises a phenanthroline compound substituted with $C_6$-$C_{40}$ aryl, $C_5$-$C_{40}$ heteroaryl and/or $C_1$-$C_{12}$ alkyl groups, preferably 2,4,7,9-tetraphenyl-1,10-phenanthroline, 4,7-diphenyl-2,9-dip-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline.

Phenanthroline compounds that can be used as second matrix materials are disclosed in EP 1786050 A1 and CN102372708 and incorporated by reference.

Other suitable second matrix compounds that can be used are quinazoline compounds substituted with aryl or heteroaryl groups, preferably 9-phenyl-9'-(4-phenyl-2-quinazolinyl)-3,3'-bi-9H-carbazole.

It is further preferred that the second matrix compound comprises a quinazoline compound substituted with $C_6$-$C_{40}$ aryl, $C_5$-$C_{40}$ heteroaryl and/or $C_1$-$C_{12}$ alkyl groups, preferably 9-phenyl-9'-(4-phenyl-2-quinazolinyl)-3,3'-bi-9H-carbzole.

Quinazoline compounds that can be used as second matrix materials are disclosed in KR2012102374 and incorporated by reference.

It is further preferred that the second matrix compound comprises a benzo[h]quinazoline compound substituted with $C_6$-$C_{40}$ aryl, $C_5$-$C_{40}$ heteroaryl and/or $C_1$-$C_{12}$ alkyl groups, preferably 4-(2-naphthalenyl)-2-[4-(3-quinolinyl)phenyl]-benzo[h]quinazoline.

Benzo[h]quinazoline compounds that can be used as second matrix materials are disclosed in KR2014076522 and incorporated by reference.

It is also preferred that the second matrix compound comprises a pyrido[3,2-h]quinazoline compound substituted with $C_6$-$C_{40}$ aryl, $C_5$-$C_{40}$ heteroaryl and/or $C_1$-$C_{12}$ alkyl groups, preferably 4-(naphthalen-1-yl)-2,7,9-triphenylpyrido[3,2-h]quinazoline.

Pyrido[3,2-h]quinazoline compounds that can be used as second matrix materials are disclosed in EP1970371 and incorporated by reference.

Extraordinary preferred second matrix compounds are that of the following structures of Table 2.

TABLE 2
Second matrix compounds which may be suitable used
| Compound | Structure |
| --- | --- |
| EIM-1 | 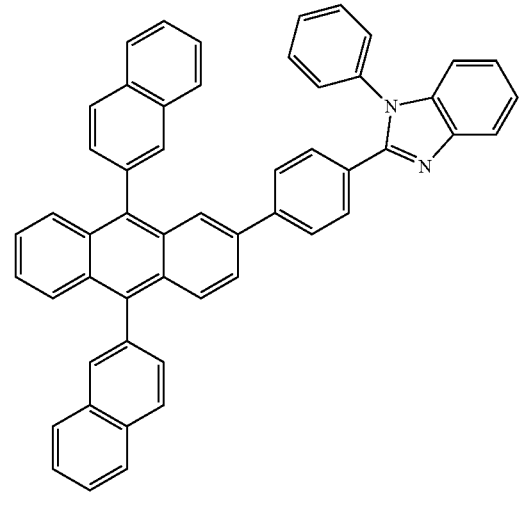 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] |
| EIM-2 | 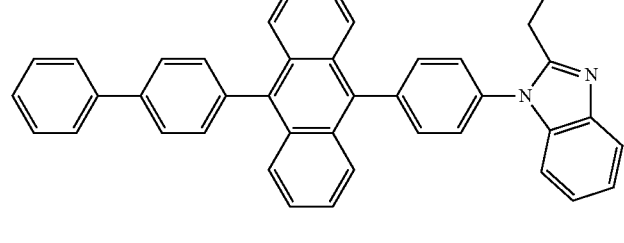 |
| EIM-3 | 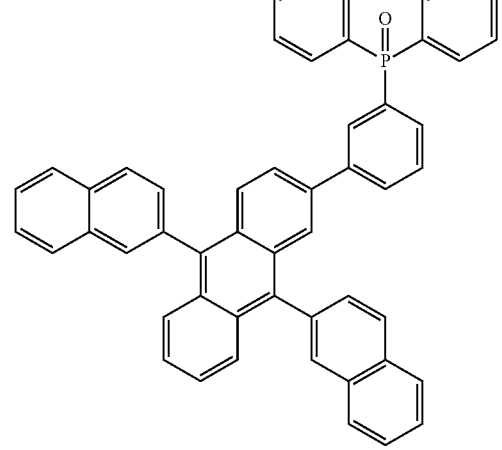 |

TABLE 2-continued
Second matrix compounds which may be suitable used
| Compound | Structure |
|---|---|
| EIM-4 | 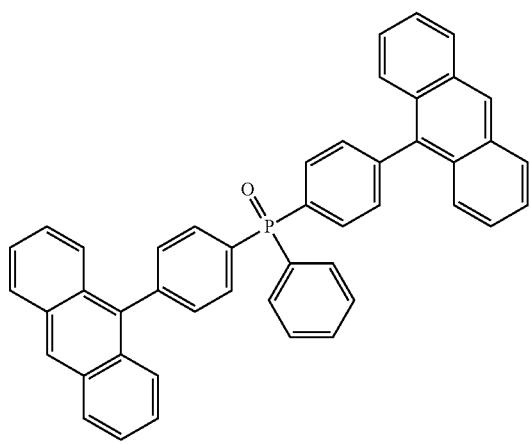 [SMILES: O=P(c1ccccc1)(c1ccc(-c2c3ccccc3cc3ccccc23)cc1)c1ccc(-c2c3ccccc3cc3ccccc23)cc1] |
| EIM-5 | 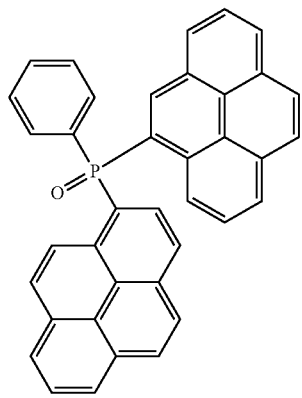 [SMILES: O=P(c1ccccc1)(c1ccc2ccc3cccc4ccc1c2c34)c1cc2cccc3ccc4cccc1c4c32] |
| EIM-6 | 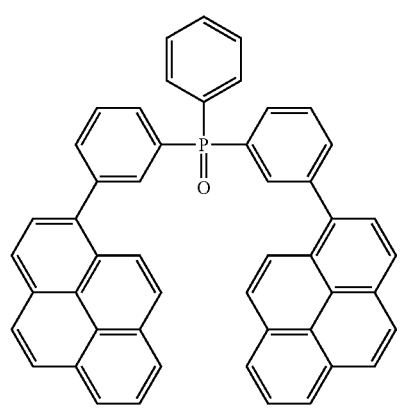 [SMILES: O=P(c1ccccc1)(c1cccc(-c2ccc3ccc4cccc5ccc2c3c45)c1)c1cccc(-c2ccc3ccc4cccc5ccc2c3c45)c1] |

TABLE 2-continued
| Second matrix compounds which may be suitable used | |
|---|---|
| Compound | Structue |
| EIM-7 | 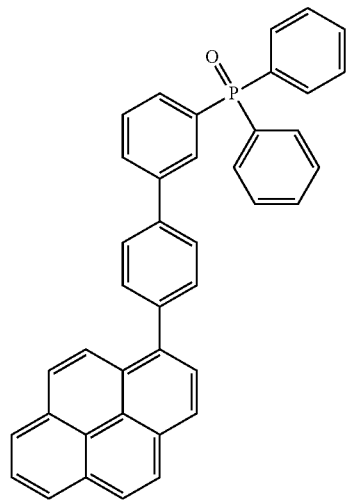 [SMILES: O=P(c1ccccc1)(c1ccccc1)c1cccc(-c2ccc(-c3ccc4ccc5cccc6ccc3c4c56)cc2)c1] |
| EIM-8 | 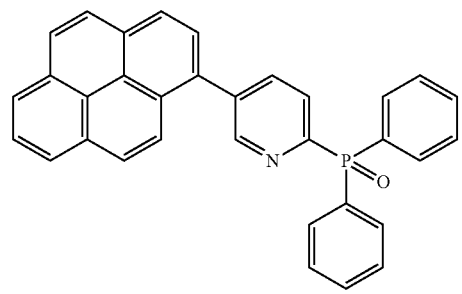 [SMILES: O=P(c1ccccc1)(c1ccccc1)c1ccc(-c2ccc3ccc4cccc5ccc2c3c45)cn1] |
| EIM-9 | 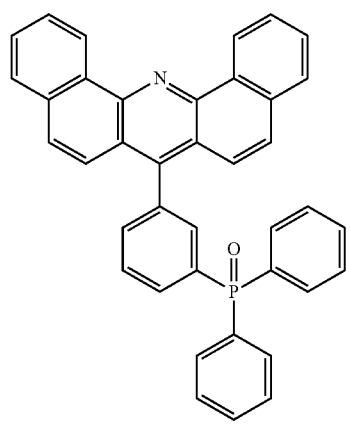 [SMILES: O=P(c1ccccc1)(c1ccccc1)c1cccc(-c2c3ccc4ccccc4c3nc3c2ccc2ccccc23)c1] |

TABLE 2-continued

| Second matrix compounds which may be suitable used | |
|---|---|
| Compound | Structure |
| EIM-10 | |
| EIM-11 | |
| EIM-12 | |
| EIM-13 | |

TABLE 2-continued
| Second matrix compounds which may be suitable used | |
|---|---|
| Compound | Structue |
| EIM-14 | 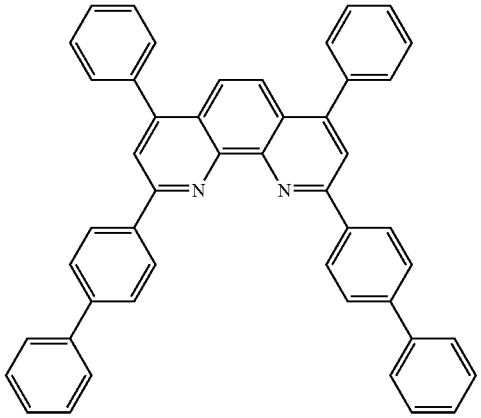 [SMILES: c1ccc(-c2ccc(-c3cc(-c4ccccc4)c4ccc5c(-c6ccccc6)cc(-c6ccc(-c7ccccc7)cc6)nc5c4n3)cc2)cc1] |
| EIM-15 | 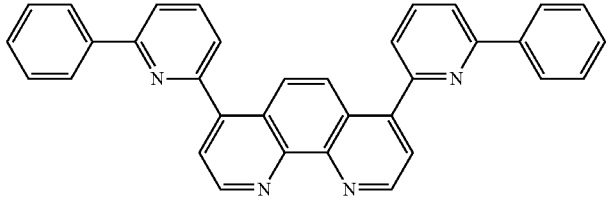 [SMILES: c1ccc(-c2cccc(-c3ccnc4c3ccc3c(-c5cccc(-c6ccccc6)n5)ccnc34)n2)cc1] |
| EIM-16 | 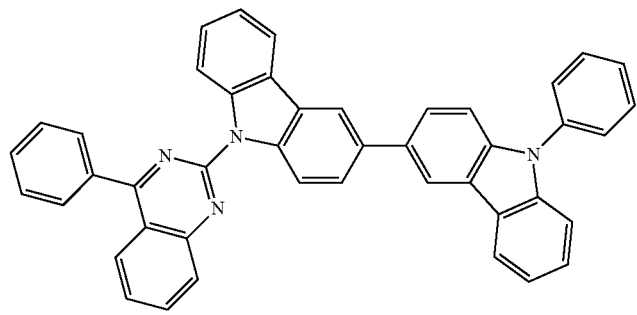 [SMILES: c1ccc(-c2nc(-n3c4ccccc4c4cc(-c5ccc6c(c5)c5ccccc5n6-c5ccccc5)ccc43)nc3ccccc23)cc1] |
| EIM-17 | 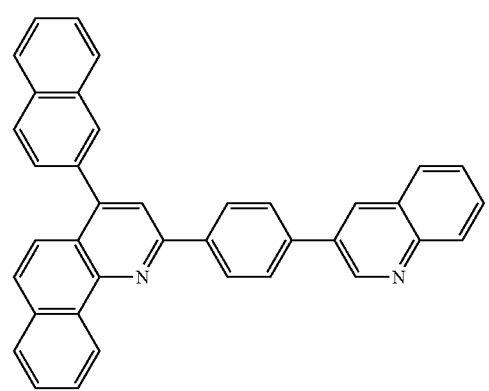 [SMILES: c1ccc2cc(-c3cc(-c4ccc(-c5cnc6ccccc6c5)cc4)nc4c3ccc3ccccc34)ccc2c1] |

TABLE 2-continued

Second matrix compounds which may be suitable used

| Compound | Structure |
|---|---|
| EIM-18 | 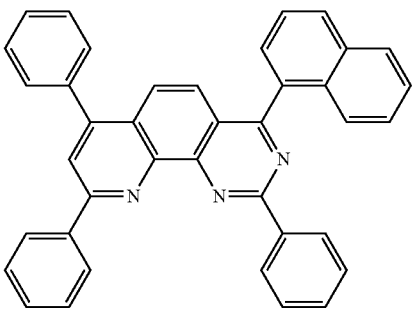 [SMILES: c1ccc(-c2cc(-c3ccccc3)c3ccc4c(-c5cccc6ccccc56)nc(-c5ccccc5)nc4c3n2)cc1] |

Alkali Organic Complex and Alkali Halide

According to various aspects the lithium halide can be selected from the group comprising LiF, LiCl, LiBr or LiJ, and preferably LiF.

According to various aspects the alkali organic complex can be a lithium organic complex and preferably the lithium organic complex can be selected from the group comprising a lithium quinolate, a lithium borate, a lithium phenolate, a lithium pyridinolate or a lithium Schiff base and lithium fluoride, preferably a lithium 2-(diphenylphosphoryl)-phenolate, lithium tetra(1H-pyrazol-1-yl)borate, a lithium quinolate of formula (III), a lithium 2-(pyridin-2-yl)phenolate and LiF, and more preferred selected from the group comprising a lithium 2-(diphenylphosphoryl)-phenolate, lithium tetra(1H-pyrazol-1-yl)borate, a lithium quinolate of formula (III) and a lithium 2-(pyridin-2-yl)phenolate. It is an essentially non-emissive compound.

More preferred, the alkali organic complex is a lithium organic complex and/or the alkali halide is lithium halide.

According to various embodiments of the organic electroluminescent device of the present invention the organic ligand of the lithium organic complex can be a borate based organic ligand. Preferably, the lithium organic complex is a compound of formula (VII)

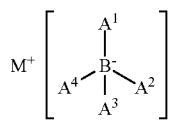 (VII)

wherein M is an alkali metal ion, each of $A^1$-$A^4$ is independently selected from substituted or unsubstituted $C_6$-$C_{20}$ aryl or substituted or unsubstituted $C_2$-$C_{20}$ heteroaryl.

Preferably, the alkali organic complex is a complex of formula (VIII)

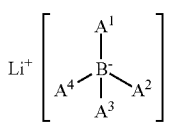 (VIII)

wherein each of $A^1$-$A^4$ is independently selected from substituted or unsubstituted $C_6$-$C_{20}$ aryl or substituted or unsubstituted $C_2$-$C_{20}$ heteroaryl.

Preferably the lithium organic complex is a lithium tetra (1H-pyrazol-1-yl)borate. Borate based organic ligands that can be suitable used are disclosed in WO 2013079676 A1 and incorporated by reference.

According to various embodiments of the organic electroluminescent device of the present invention the organic ligand of the lithium organic complex can be a phenolate ligand.

According to various embodiments of the organic electroluminescent device of the present invention the organic ligand of the lithium organic complex can be a phosphoryl phenolate ligand.

Preferably the lithium organic complex is a phosphoryl phenolate compound of formula (IX):

 (IX)

wherein $A^5$ is a $C_6$-$C_{20}$ arylene and each of $A^6$-$A^7$ is independently selected from a $C_6$-$C_{20}$ aryl, wherein $A^5$, $A^6$ and $A^7$ may be unsubstituted or substituted with groups comprising C and H or with a further LiO group, provided that the given C count in an aryl or arylene group includes also all substituents present on the said group. Preferably the lithium organic complex is a lithium 2-(diphenylphosphoryl)phenolate. Phenolate ligands that can be suitable used are disclosed in WO 2013079678 A1 and incorporated by reference.

Further, phenolate ligands can be selected from the group comprising pyridinolate, preferably 2-(diphenylphosphoryl) pyridin-3-olate. Pyridine phenolate ligands that can be suitable used are disclosed in JP 2008195623 and incorporated by reference.

In addition, phenolate ligands can be selected from the group comprising imidazole phenolates, preferably 2-(1-phenyl-1H-benzo[d]imidazol-2-yl)phenolate. Imidazol phenolate ligands that can be suitable used are disclosed in JP 2001291593 and incorporated by reference.

Also, phenolate ligands can be selected from the group comprising oxazol phenolates, preferably 2-(benzo[d]oxazol-2-yl)phenolate. Oxazol phenolate ligands that can be suitable used are disclosed in US 20030165711 and incorporated by reference.

According to various embodiments of the organic electroluminescent device of the present invention the organic ligand of the lithium organic complex can be a phosphoryl heteroaryloate ligand.

Preferably the lithium organic complex is a phosphoryl heteroaryloate compound of formula (X):

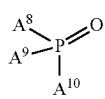

(X)

wherein $A^8$, $A^9$ and $A^{10}$ are independently selected from $C_1$-$C_{30}$-alkyl, $C_3$-$C_{30}$-cycloalkyl, $C_2$-$C_{30}$-heteroalkyl, $C_6$-$C_{30}$-aryl, $C_2$-$C_{30}$-heteroaryl, $C_1$-$C_{30}$-alkoxy, $C_3$-$C_{30}$-cycloalkyloxy, $C_6$-$C_{30}$-aryloxy, and from structural unit having general formula E-Z—, wherein Z is a spacer unit containing trivalent nitrogen atom bearing a lone electron pair, wherein the spacer unit has a structure which allows formation of a 5-, 6- or 7-membered chelate ring with the metal cation, wherein the chelate ring comprises the oxygen atom of the phosphine oxide group and trivalent nitrogen atom of the spacer unit coordinated to the metal cation and E is an electron transporting unit comprising a conjugated system of at least 10 delocalized electrons, and at least one group selected from $A^8$, $A^9$ and $A^0$ has the general formula E-Z—.

Preferably the lithium organic complex is a lithium 2-(diphenylphosphoryl)pyridin-3-olate. Heteroarylolate ligands that can be suitable used are disclosed in EP 2724388 and incorporated by reference.

According to various embodiments of the organic electroluminescent device of the present invention the organic ligand of the alkali organic complex can be selected from a borate ligand and a phosphoryl phenolate ligand and a heteroarylolate ligand. Preferably, the organic ligand of the alkali organic complex is selected from a borate ligand and a phosphoryl phenolate ligand.

More preferably the lithium organic complex can be selected from the group comprising a lithium quinolate, a lithium borate, a lithium phenolate, a lithium pyridinolate or a lithium Schiff base; preferably the lithium organic complex, is selected from the group comprising a lithium quinolate, a lithium borate, a lithium phenolate, a lithium pyridinolate or a lithium Schiff base;

preferably the lithium quinolate has the formula XI, XII or XIII:

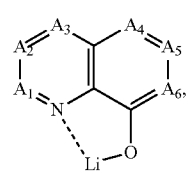

(XI)

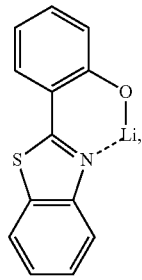

(XII)

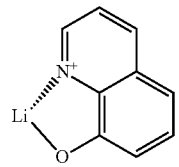

(XIII)

wherein $A_1$ to $A_6$ are same or independently selected from CH, CR, N, O;

R is same or independently selected from hydrogen, halogen, alkyl or aryl or heteroaryl with 1 to 20 carbon atoms; and more preferred $A_1$ to $A_6$ are CH;

preferably the lithium borate is a lithium tetra(1H-pyrazol-1-yl)borate;

preferably the lithium phenolate is a lithium 2-(pyridin-2-yl)phenolate, a lithium 2-(diphenylphosphoryl)phenolate, a lithium imidazol phenolates, or a lithium 2-(pyridin-2-yl)phenolate and more preferred a lithium 2-(1-phenyl-1H-benzo[d]imidazol-2-yl)phenolate, or a lithium 2-(benzo[d]oxazol-2-yl)phenolate;

preferably the lithium pyridinolate is a lithium 2-(diphenylphosphoryl)pyridin-3-olate, preferably the lithium Schiff base has the structure 100, 101, 102 or 103:

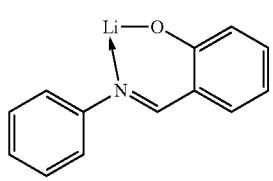

100

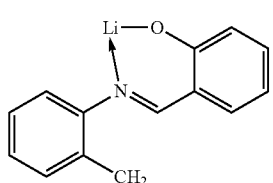

101

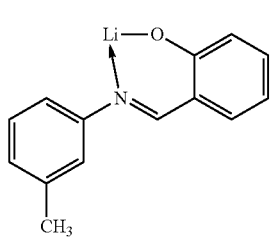

102

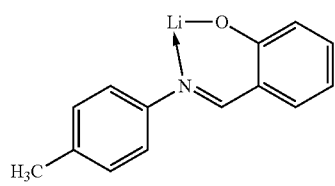
103

Quinolates that can be suitable used are disclosed in WO 2013079217 A1 and incorporated by reference.

According to various embodiments of the organic electroluminescent device of the present invention the organic ligand of the lithium organic complex can be a phenolate ligand, Preferably the lithium organic complex is a lithium 2-(diphenylphosphoryl)phenolate. Phenolate ligands that can be suitable used are disclosed in WO 2013079678 A1 and incorporated by reference.

Further, phenolate ligands can be selected from the group comprising pyridinolate, preferably 2-(diphenylphosphoryl) pyridin-3-olate. Pyridine phenolate ligands that can be suitable used are disclosed in JP 2008195623 and incorporated by reference.

In addition, phenolate ligands can be selected from the group comprising imidazol phenolates, preferably 2-(1-phenyl-1H-benzo[d]imidazol-2-yl)phenolate. Imidazole phenolate ligands that can be suitable used are disclosed in JP 2001291593 and incorporated by reference.

Also, phenolate ligands can be selected from the group comprising oxazol phenolates, preferably 2-(benzo[d]oxazol-2-yl)phenolate. Oxazol phenolate ligands that can be suitable used are disclosed in US 20030165711 and incorporated by reference.

Lithium Schiff base organic complexes can be use. Lithium Schiff base organic complexes that can be suitable used having the structure 100, 101, 102 or 103:

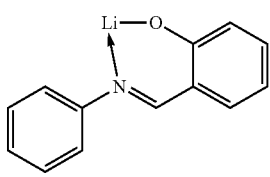
100

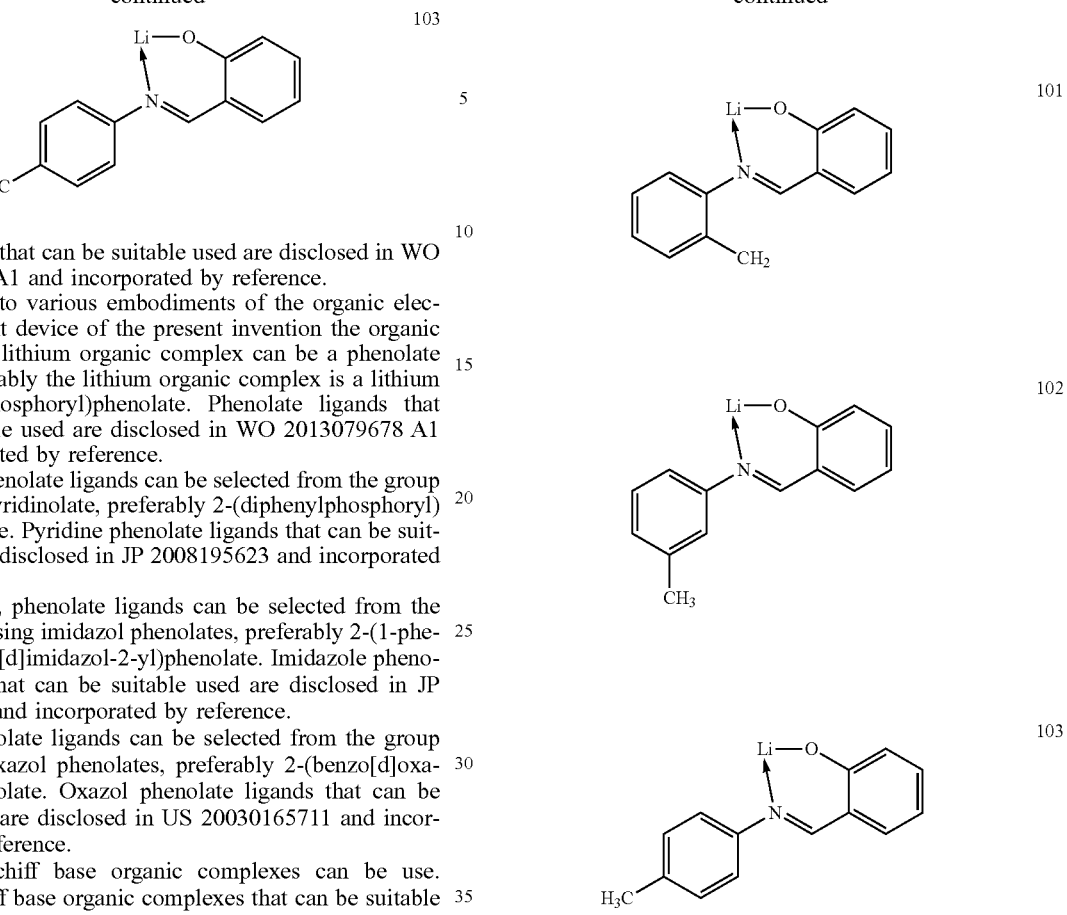

Suitable organic ligands to form a lithium organic complex that can be used for the electron injection layer are disclosed, and incorporated by reference, for example in US 2014/0048792 and Kathirgmanthan, Poopathy; Arkley, Vincent; Surendrakumar, Sivagnanasundram; Chan, Yun F.; Ravichandran, Seenivasagam; Ganeshamurugan, Subramaniam; Kumaraverl, Muttulingam; Antipan-Lara, Juan; Paramaswara, Gnanamolly; Reddy, Vanga R., Digest of Technical Papers—Society for Information Display International Symposium (2010), 41(Bk. 1), 465-468.

Extraordinary preferred lithium organic complexes which may be used in the present invention are summarized in the following table 3.

TABLE 3

| Lithium organic complex that can be suitable used | | | |
|---|---|---|---|
| Compound | Name | Structure | Reference |
| LiQ | lithium 8-hydroxyquinolate | | WO 2013079217 A1 |

TABLE 3-continued

Lithium organic complex that can be suitable used

| Compound | Name | Structure | Reference |
|---|---|---|---|
| Li-1 | lithium tetra(1H-pyrazol-1-yl)borate | | WO 2013079676 A1 |
| Li-2 | lithium 2-(diphenyl-phosphoryl)phenolate | | WO 2013079678A1 |
| Li-3 | lithium 2-(pyridin-2-yl)phenolate | | JP2 008195623 |
| Li-4 | lithium 2-(1-phenyl-1H-benzo[d]imidazol-2-yl)phenolate | | JP 2001291593 |
| Li-5 | lithium 2-(benzo[d]oxazol-2-yl)phenolate | | US 20030165711 |
| Li-6 | lithium 2-(diphenyl-phosphoryl)pyridin-3-olate | | EP 2724388 |

It is preferred that the organic electroluminescent device according to the present invention is an organic light-emitting diode (OLED).

The organic light-emitting diode (OLED) may be a bottom- or top-emitting diode.

In a preferred embodiment, the thickness of the undoped electron transport layer is at least two times the thickness of the electron injection layer, preferably the thickness of the undoped electron transport layer is at least three times the thickness of the electron injection layer, even more preferred the thickness of the undoped electron transport layer is at least four times the thickness of the electron injection layer, also preferred the thickness of the undoped electron transport layer is at least eight times the thickness of the electron injection layer. The maximum thickness of the undoped electron injection layer is 200 nm.

More preferred, the emission layer comprises a fluorescent blue emitter.

Most preferred, the organic electroluminescent device is a fluorescent blue device.

Finally, it is preferred that the emission layer further comprises an anthracene matrix compound substituted with $C_6$-$C_{40}$ aryl, $C_5$-$C_{40}$ heteroaryl and/or $C_1$-$C_{12}$ alkyl groups.

According to another aspect, the organic electroluminescent device according to the present invention may comprise more than one emission layer, preferably two or three emission layers.

According to another aspect, the organic electroluminescent device comprises a charge generation layer (CGL).

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

In the context of the present specification the term "different" or "differs" in connection with the lithium compound means that the lithium compound differs in their structural formula.

The external quantum efficiency, also named EQE, is measured in percent (%).

The power efficiency, also named PEff, is measured in lumen per Watt (lm/W).

The lifetime, also named LT, between starting brightness and 97% of the original brightness is measured in hours (h).

The voltage, also named V, is measured in Volt (V) at 10 milliAmpere per square centimeter (mA/cm2) in bottom emission devices and at 15 mA/cm2 in top emission devices.

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED" and "organic light-emitting diode" is simultaneously used and having the same meaning.

The term "electron transport layer stack" as used in the specification comprises at least two electron transport layers or at least three electron transport layers.

The term "different compound" as used in connection with the matrix compound means that the matrix compound differs from the other matrix compound in its chemical formula.

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective electron transport layer are selected such that it does not exceed 100 wt-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

In the context that the undoped electron transport layer is free of a dopant, alkali halide, and/or alkali organic complex, the term "free of" means that the so called "free off" undoped electron transport layer may comprise of about 5 wt.-% or less of a dopant, alkali halide and/or a alkali organic complex, preferably about 0.5 wt.-% or less, and more preferably about 0.05 wt.-% or less, and even more preferably about 0.005 wt.-% or less of a dopant, alkali halide and/or alkali organic complex and most preferred is free of a dopant, alkali halide and/or a alkali organic complex.

The term "alkyl" as used herein shall encompass linear as well as well as branched alkyl. For example, $C_3$-alkyl may be selected from n-propyl and iso-propyl. Likewise, $C_4$-alkyl encompasses n-butyl, sec-butyl and t-butyl.

The term "alkoxy" as used herein shall encompass linear and branched alkoxy. For example, $C_3$-alkoxy encompasses n-propoxy and iso-propoxy.

The subscripted number n in $C_n$ relates to the total number of carbon atoms in the respective alkyl, alkoxy, aryl or heteroaryl group.

The term "aryl" as used herein shall encompass phenyl ($C_6$-aryl), fused aromatics, such as naphthalene, anthracene, phenanthrene, tetracene, etc. Further encompassed are biphenyl or oligo- or polyphenyls, such as terphenyl etc. Further encompassed shall be any further aromatic hydrocarbon substituents, such as fluorenyl etc.

The term "heteroaryl" as used herein shall encompass any aryl compound as defined above in which one or more of the carbon atoms comprised in the aromatic ring system is substituted by a hetero atom, preferably N, O, or S.

Depending from the number of groups attached to the aryl moiety, the term aryl as used herein may be synonymous to the term arylene. For example, in case of $Ar^1$ being $C_6$- to $C_{20}$-aryl, it is clear from the two moieties (B and $Ar^2$) attached to the $Ar^1$ that aryl is arylene in this case.

In case of the aryl group being substituted, the aryl group may comprise one or more substituents.

In the formula representing the methylene- and the oxy-moiety "—" is for the chemical bond to the adjacent moiety.

The before mentioned organic electroluminescent devices may comprise one or more of the following components, selected from substrate, anode, hole injection layer, emission layer, hole blocking layer and cathode as defined below.

Substrate

The substrate may be any substrate that is commonly used in manufacturing of organic light-emitting diodes. If light is emitted through the substrate, the substrate may be a transparent material, for example a glass substrate or a transparent plastic substrate, having excellent mechanical strength, thermal stability, transparency, surface smoothness, ease of handling, and waterproofness. If light is emitted through the top surface, the substrate may be a transparent or non-transparent material, for example a glass substrate, a plastic substrate, a metal substrate or a silicon substrate.

Anode

The anode may be formed by depositing or sputtering a compound that is used to form the anode. The compound used to form the anode may be a high work-function compound, so as to facilitate hole injection. The anode material may also be selected from a low work furction material (i.e. Aluminum). The anode may be a transparent or reflective electrode. Transparent conductive compounds, such as indium tin oxide (ITO), indium zinc oxide (IZO), tin-dioxide ($SnO_2$), and zinc oxide (ZnO), may be used to form the anode 120. The anode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

Hole Injection Layer

The hole injection layer (HIL) 130 may be formed on the anode 120 by vacuum deposition, spin coating, printing, casting, slot-die coating, Langmuir-Blodgett (LB) deposition, or the like. When the HIL 130 is formed using vacuum deposition, the deposition conditions may vary according to the compound that is used to form the HIL 130, and the desired structure and thermal properties of the HIL 130. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL 130 is formed using spin coating, printing, coating conditions may vary according to a compound that is used to form the HIL 130, and the desired structure and thermal properties of the HIL 130. For example, the coating conditions may include a coating speed of about 2000 rpm to about 5000 rpm, and a thermal treatment temperature of about 80° C. to about 200° C. Thermal treatment removes a solvent after the coating is performed.

The HIL 130 may be formed of any compound that is commonly used to form an HIL. Examples of compounds that may be used to form the HIL 130 include a phthalocyanine compound, such as copper phthalocyanine (CuPc), 4,4',4"-tris(3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PAN/PSS).

The HIL 130 may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N'-bis(phenyl)-benzidine) doped with F4TCNQ. α-NPD doped with 2,2'-(perfluoronaphthalen-2, 6-diylidene) dimalononitrile (PD1). α-NPD doped with 2,2', 2"-(cyclopropne-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

The thickness of the HIL 130 may be in the range of about 1 nm to about 100 nm, and for example, about 1 nm to about 25 nm. When the thickness of the HIL 130 is within this range, the HIL 130 may have excellent hole injecting characteristics, without a substantial increase in driving voltage.

Hole Transport Layer

The hole transport layer (HTL) 140 may be formed on the HIL 130 by vacuum deposition, spin coating, slot-die coating, printing, casting, Langmuir-Blodgett (LB) deposition, or the like. When the HTL 140 is formed by vacuum deposition or spin coating, the conditions for deposition and coating may be similar to those for the formation of the HIL 130. However, the conditions for the vacuum or solution deposition may vary, according to the compound that is used to form the HTL 140.

The HTL 140 may be formed of any compound that is commonly used to form a HTL. Compound that can be suitably used is disclosed for example in Yasuhiko Shirota and Hiroshi Kageyama, Chem. Rev. 2007, 107, 953-1010 and incorporated by reference. Examples of the compound that may be used to form the HTL 140 are: a carbazole derivative, such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD), or N,N'-di(naphthalen-1-yl)-N,N'-diphenyl benzydine (alpha-NPD); and a triphenylamine-based compound, such as 4,4',4"-tris(N-carbazolyl) triphenylamine (TCTA). Among these compounds, TCTA can transport holes and inhibit excitons from being diffused into the EML.

The thickness of the HTL 140 may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL 140 may be 170 nm to 200 nm.

When the thickness of the HTL 140 is within this range, the HTL 140 may have excellent hole transporting characteristics, without a substantial increase in driving voltage.

Emission Layer (EML)

The EML 150 may be formed on the HTL by vacuum deposition, spin coating, slot-die coating, printing, casting, LB, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and a dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA), Bis(2-(2-hydroxyphenyl)benzothiazolate)zinc (Zn(BTZ) 2), E3 below, ADN, Compound 1 below, and Compound 2 below.

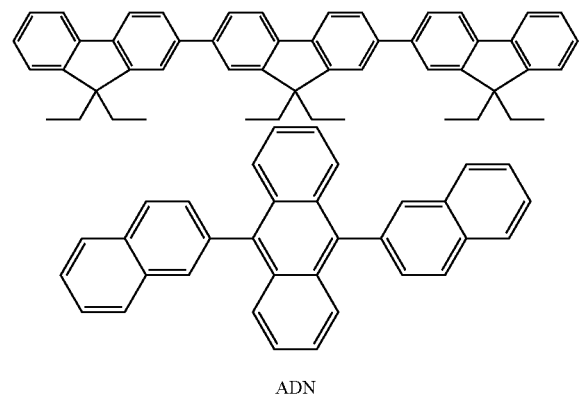

E3

ADN

-continued

Compound 1

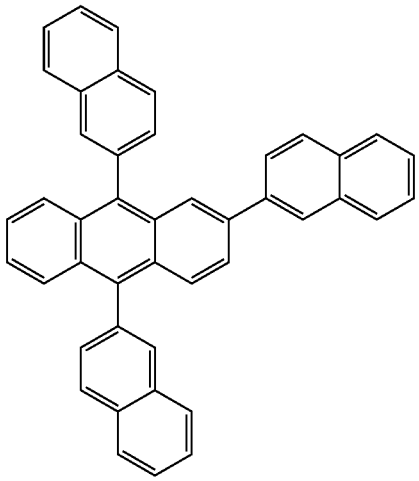

Compound 2

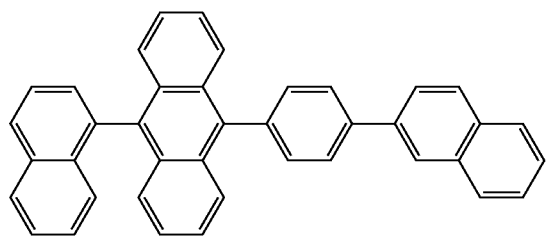

Particularly preferred is an anthracene matrix compound represented by Formula 400 below:

Formula 400

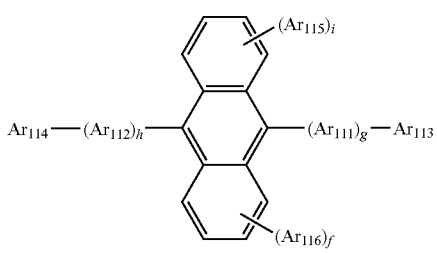

In Formula 400, $Ar_{111}$ and $Ar_{112}$ may be each independently a substituted or unsubstituted $C_6$-$C_{60}$ arylene group; $Ar_{113}$ to $Ar_{116}$ may be each independently a substituted or unsubstituted $C_1$-$C_{10}$ alkyl group or a substituted or unsubstituted $C_6$-$C_{60}$ aryl group; and g, h, i, and j may be each independently an integer from 0 to 4.

In some embodiments, $Ar_{111}$ and $Ar_{112}$ in Formula 400 may be each independently one of
a phenylene group, a naphthylene group, a phenanthrenylene group, or a pyrenylene group; or
a phenylene group, a naphthylene group, a phenanthrenylene group, a fluorenyl group, or a pyrenylene group, each substituted with at least one of a phenyl group, a naphthyl group, or an anthryl group.

In Formula 400, g, h, i, and j may be each independently an integer of 0, 1, or 2.

In Formula 400, $Ar_{113}$ to $Ar_{116}$ may be each independently one of
a $C_1$-$C_{10}$ alkyl group substituted with at least one of a phenyl group, a naphthyl group, or an anthryl group;

a phenyl group, a naphthyl group, an anthryl group, a pyrenyl group, a phenanthrenyl group, or a fluorenyl group;
a phenyl group, a naphthyl group, an anthryl group, a pyrenyl group, a phenanthrenyl group, or a fluorenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof a sulfonic acid group or a salt thereof a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group; or

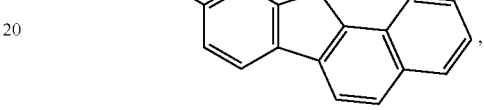

or formulas (2) or (3)

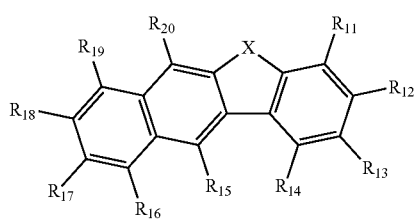
(2)

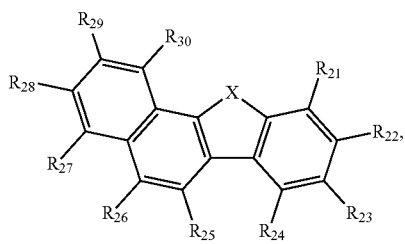
(3)

Wherein in the formulas (2) and (3), X is selected form an oxygen atom and a sulfur atom, but embodiments of the invention are not limited thereto.

In the formula (2), any one of $R_{11}$ to $R_{14}$ is used for bonding to $Ar_{111}$. $R_{11}$ to $R_{14}$ that are not used for bonding to $Ar_{111}$ and $R_{15}$ to $R_{20}$ are the same as $R_1$ to $R_8$.

In the formula (3), any one of $R_{21}$ to $R_{24}$ is used for bonding to $Ar_{111}$. $R_{21}$ to $R_{24}$ that are not used for bonding to $Ar_{111}$ and $R_{25}$ to $R_{30}$ are the same as $R_1$ to $R_8$.

In a further embodiment, there is provided an organic electroluminescent device comprising an anode, a cathode, an emission layer, an undoped electron transport layer comprising a first matrix compound, and an electron injection layer comprising a second matrix compound and an alkali organic complex and/or alkali halide, wherein the undoped electron transport layer and the electron injection layer are arranged between the emission layer and the cathode,
wherein the reduction potential of the first matrix compound is less negative than the reduction potential of 9,10-di (naphthalen-2-yl)anthracene and more negative than the reduction potential of 4,4'-bis(4,6-diphenyl-1,3,5-triazin-2-yl)biphenyl,
wherein the reduction potential in both cases is measured against Fc/Fc$^+$ in tetrahydrofurane; and the dipole moment of the first matrix compound is selected ≥0 Debye and ≤2.5 Debye and the dipole moment of the second matrix compound is selected >2.5 and <10 Debye; and
wherein the off-set between the reduction potential of the EML host and the reduction potential of the first matrix compound is selected ≥0.05 and ≤0.35 V, preferably ≥0.1 and ≤0.3 V; and
the emission layer is in direct contact with the undoped electron transport layer; and
wherein the emission layer comprises an EML host; and
wherein the EML host is selected from an anthracene matrix compound represented by Formula 400 above.

In a further embodiment, there is provided an organic electroluminescent device comprising an anode, a cathode, an emission layer, an undoped electron transport layer comprising a first matrix compound, and an electron injection layer comprising a second matrix compound and an alkali organic complex and/or alkali halide,
wherein the undoped electron transport layer and the electron injection layer are arranged between the emission layer and the cathode, wherein the reduction potential of the first matrix compound is less negative than the reduction potential of 9,10-di(naphthalen-2-yl)anthracene and more negative than the reduction potential of 4,4'-bis(4,6-diphenyl-1, 3,5-triazin-2-yl)biphenyl,
wherein the reduction potential in both cases is measured against Fc/Fc$^+$ in tetrahydrofurane; and the dipole moment of the first matrix compound is selected ≥0 Debye and ≤2.5 Debye and the dipole moment of the second matrix compound is selected >2.5 and <10 Debye; and
the emission layer is in direct contact with the undoped electron transport layer; and
wherein the emission layer comprises an EML host; and
wherein the off-set between the reduction potential of the EML host and the reduction potential of the first matrix compound is selected ≥0.05 and ≤0.35 V, preferably ≥0.1 and ≤0.3 V; and
wherein the dipole moment of the EML host is selected ≥0.2 Debye and ≤1.45 Debye, preferably ≥0.4 Debye and ≤1.2 Debye, also preferred ≥0.6 Debye and ≤1.1 Debye.

Preferably, the EML host comprises between one and three heteroatoms selected from the group consisting of N, O or S. More preferred the EML host comprises one heteroatom selected from S or O.

If the EML host is selected in this range, the dipole moment can be well achieved and very good performance is obtained.

The dipole moment is calculated using the optimized using the hybrid functional B3LYP with the 6-31G* basis set as implemented in the program package TURBOMOLE V6.5. If more than one conformation is viable, the conformation with the lowest total energy is selected to determine the dipole moment of the molecules. Using this method, 2-(10-phenyl-9-anthracenyl)-benzo[b]naphtho[2,3-d]furan (CAS 1627916-48-6) has a dipole moment of 0.88 Debye, 2-(6-(10-phenylanthracen-9-yl)naphthalen-2-yl)dibenzo[b, d]thiophene (CAS 1838604-62-8) of 0.89 Debye, 2-(6-(10-phenylanthracen-9-yl)naphthalen-2-yl)dibenzo[b,d]furan (CAS 1842354-89-5) of 0.69 Debye, 2-(7-(phenanthren-9-yl)tetraphen-12-yl)dibenzo[b,d]furan (CAS 1965338-95-7) of 0.64 Debye, 4-(4-(7-(naphthalen-1-yl)tetraphen-12-yl)phenyl)dibenzo[b,d]furan (CAS 1965338-96-8) of 1.01 Debye.

The dopant may be a phosphorescent or fluorescent emitter. Phosphorescent emitters are preferred due to their higher efficiency Examples of a red dopant are PtOEP, Ir(piq) 3, and Btp 2lr(acac), but are not limited thereto. These compounds are phosphorescent emitters, however, fluorescent red dopants could also be used.

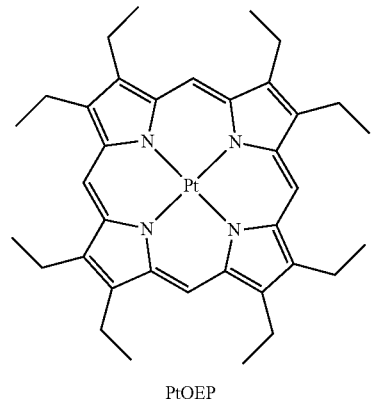

PtOEP

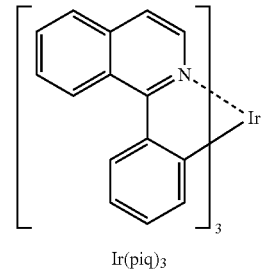

Ir(piq)$_3$

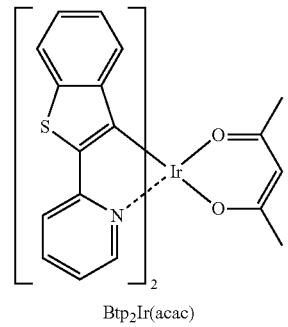

Btp$_2$Ir(acac)

Examples of a phosphorescent green dopant are Ir(ppy) 3 (ppy=phenylpyridine), Ir(ppy) 2(acac), Ir(mpyp) 3 are shown below. Compound 3 is an example of a fluorescent green emitter and the structure is shown below.

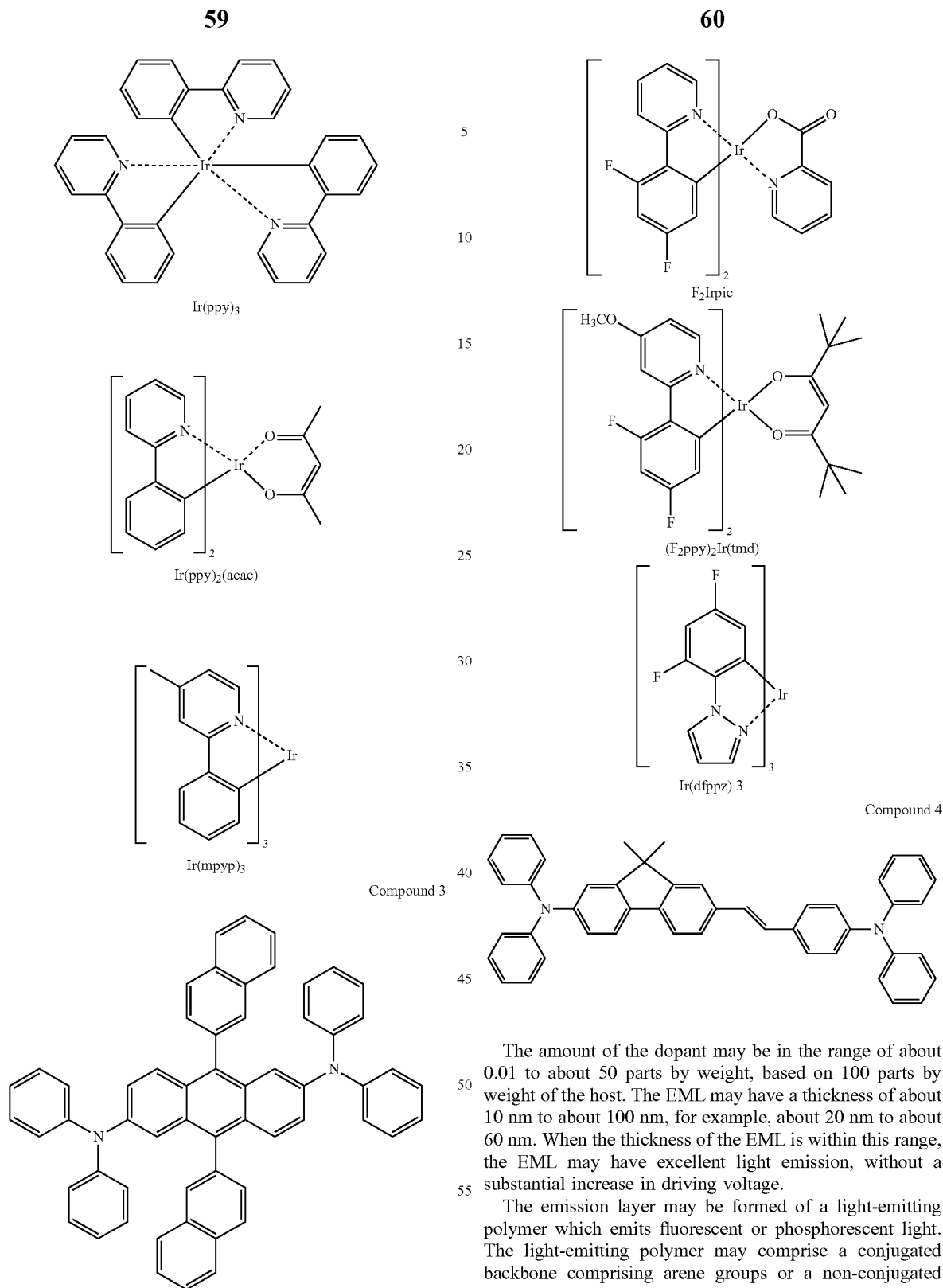

Examples of a phosphorescent blue dopant are F₂Irpic, (F₂ppy)₂Ir(tmd) and Ir(dfppz) 3, ter-fluorene, the structures are shown below. 4,4'-bis(4-diphenyl amiostyryl)biphenyl (DPAVBi), 2,5,8,11-tetratert-butyl perylene (TBPe), and Compound 4 below are examples of fluorescent blue dopants.

The amount of the dopant may be in the range of about 0.01 to about 50 parts by weight, based on 100 parts by weight of the host. The EML may have a thickness of about 10 nm to about 100 nm, for example, about 20 nm to about 60 nm. When the thickness of the EML is within this range, the EML may have excellent light emission, without a substantial increase in driving voltage.

The emission layer may be formed of a light-emitting polymer which emits fluorescent or phosphorescent light. The light-emitting polymer may comprise a conjugated backbone comprising arene groups or a non-conjugated backbone. Preferably, the conjugated backbone comprises fluorene, phenanthrene and/or triarylamine groups. If the light-emitting polymer emits light from the triplet state, the polymer may comprise phosphorescent metal complexes in the backbone or attached to the backbone.

Hole Blocking Layer (HBL)

When the EML comprises a phosphorescent dopant, a hole blocking layer (HBL) may be formed on the EML, by using vacuum deposition, spin coating, slot-die coating, printing, casting, LB deposition, or the like, in order to prevent the diffusion of triplet excitons or holes into the ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include an oxadiazole derivative, a triazole derivative, and a phenanthroline derivative.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

Cathode

The cathode is formed on the EIL. The cathode may be a cathode, which is an electron-injecting electrode. The cathode may be formed of a metal, an alloy, an electrically conductive compound, or a mixture thereof. The cathode may have a low work function. For example, the cathode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. In addition, the cathode may be formed of a transparent conductive material, such as ITO or IZO.

The thickness of the cathode may be in the range of about 5 nm to 1000 nm, for example, in the range of 10 nm to 100 am. When the cathode is in the range of 5 nm to 50 nm, the electrode will transparent even if a metal or metal alloy is used.

The cathode is not an electron injection layer or electron transport layer.

Since the layers of the ETL have similar or identical energy levels, the injection and transport of the electrons may be controlled, and the holes may be efficiently blocked. Thus, the OLED may have long lifetime.

Organic Electroluminescent Device

According to another aspect of the present invention, there is provided an organic electroluminescent device comprising: a substrate; a anode formed on the substrate; a hole injection layer, a hole transport layer, an emission layer, an undoped electron transport layer, an electron injection layer, and a cathode.

According to another aspect of the present invention, there is provided an organic electroluminescent device comprising: a substrate; a anode formed on the substrate; a hole injection layer, a hole transport layer, an emission layer, a hole blocking layer, an undoped electron transport layer, an electron injection layer, and a cathode.

According to another aspect of the present invention, there is provided a method of manufacturing an organic electroluminescent device, the method using:

at least one deposition source, preferably two deposition sources and more preferred at least three deposition sources; and/or deposition via vacuum thermal evaporation; and/or deposition via solution processing, preferably the processing is selected from spin-coating, printing, casting and/or slot-die coating.

Surprisingly, it was found that the inventive organic electroluminescent device solve the problem underlying the present invention by being superior over the organic electroluminescent devices known in the art, in particular with respect to power efficiency. The inventors have surprisingly found that particular good performance can be achieved when using the organic electroluminescent device as a fluorescent blue device. The specific arrangements mentioned herein as preferred were found to be particularly advantageous.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
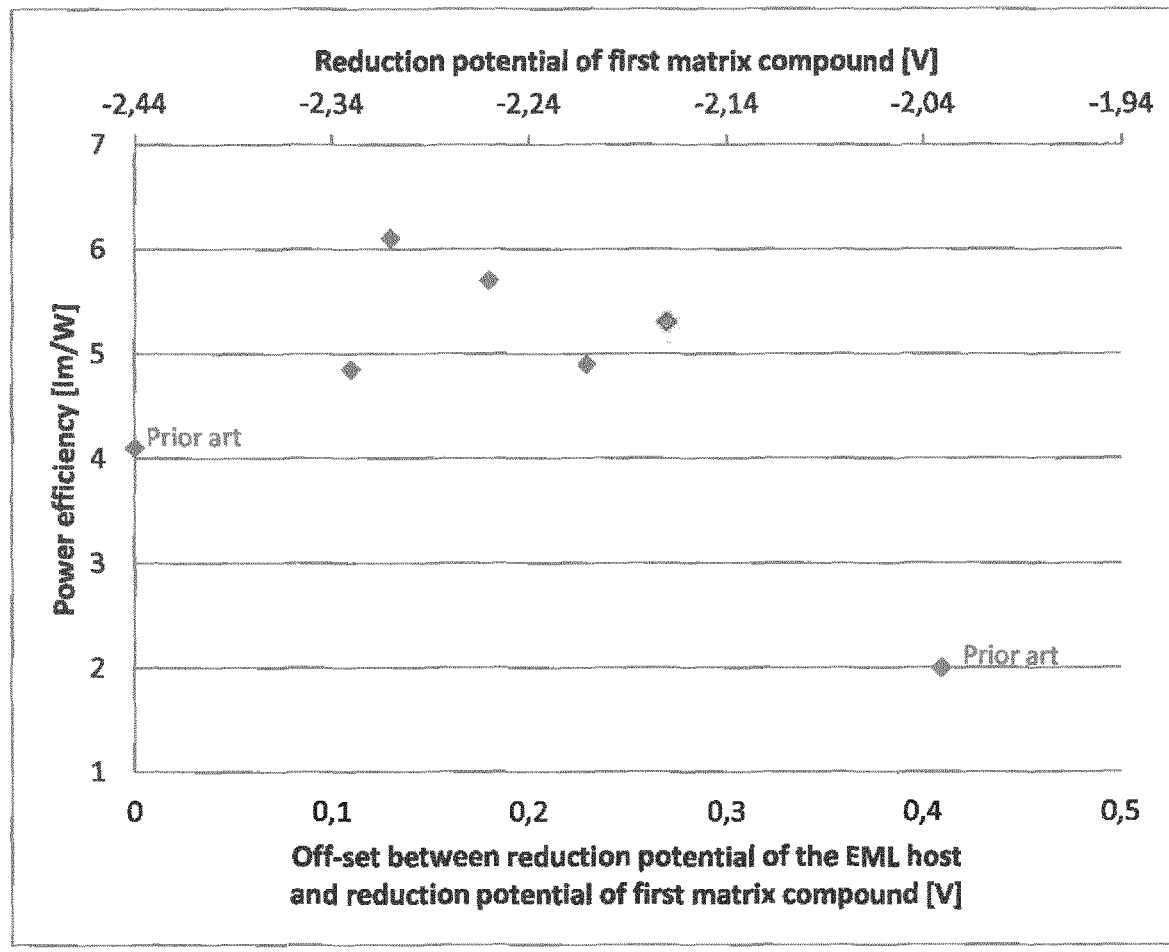
FIG. 1 shows a graph where power efficiency in lm/W is plotted against (a) the off-set in reduction potential between the EML host and the first matrix compound in Volt (primary x-axis) and (b) the reduction potential of the first matrix compound measured against $Fc/Fc^+$ in tetrahydrofurane in Volt (secondary x-axis).

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a graph wherein the power efficiency in lm/W is plotted (a) against off-set between reduction potential of the EML host and reduction potential of the first matrix compound in Volt (primary x-axis) and (b) the reduction potential of the first matrix compound measured against $Fc/Fc^+$ in tetrahydrofurane in Volt (secondary x-axis). As can be clearly seen, a small off-set in reduction potential of the EML host and the first matrix compound leads to low power efficiency. Additionally, a very large off-set between reduction potential of the EML host and first matrix compound results in low power efficiency. A polar first matrix compound also leads to poor performance. Surprisingly, it was found that the power efficiency is significantly increased if a small off-set in reduction potential between the EML host and first matrix compound is present and the first matrix compound is a polar compound.

Figure 2:
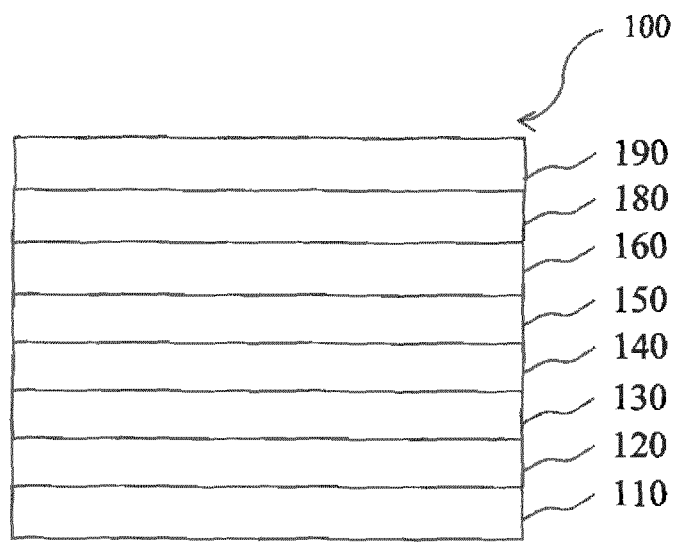
FIG. 2 is a schematic sectional view of an organic electroluminescent device, according to an exemplary embodiment of the present invention.

FIG. 2 is a schematic sectional view of an organic electroluminescent device (OLED) 100, according to an exemplary embodiment of the present invention. The OLED 100 includes a substrate 110, a first electrode 120, a hole injection layer (HIL) 130, a hole transport layer (HTL) 140, an emission layer (EML) 150, an undoped electron transport layer (ETL) 161. The undoped electron transport layer (ETL) 161 is formed directly on the EML 150. The electron injection layer (EIL) 180 is formed directly on the ETL. A cathode 190 is disposed on the electron injection layer 180.

Figure 3:
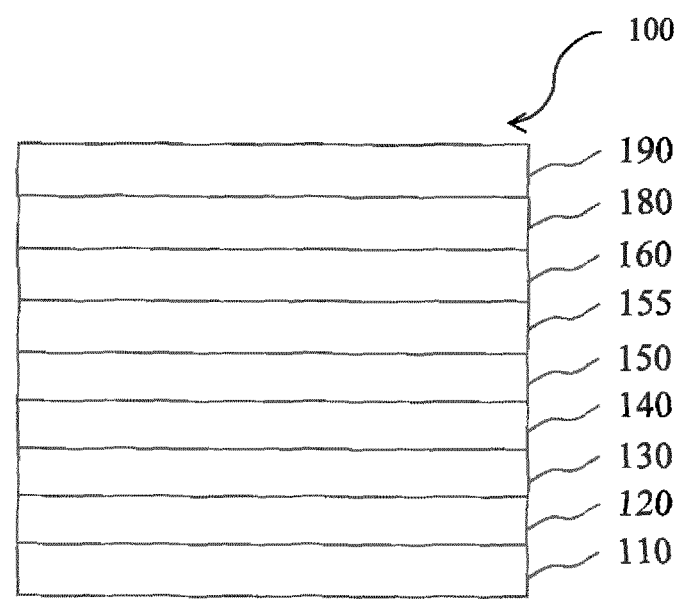
FIG. 3 is a schematic sectional view of an organic electroluminescent device, according to another exemplary embodiment of the present invention.

FIG. 3 is a schematic sectional view of an OLED 100, according to another exemplary embodiment of the present invention. FIG. 3 differs from FIG. 2 in that the OLED 100 of FIG. 3 comprises a hole blocking layer (HBL) 155.

In the description above the method of manufacture an OLED of the present invention is started with a substrate 110 onto which an anode 120 is formed, on the anode 120, an hole injection layer 130, hole transport layer 140, an emission layer 150, optional a hole blocking layer 155, at least one electron transport layer 161, at least one electron injection layer 180, and a cathode 190 are formed, in that order or the other way around.

While not shown in FIG. 2 and FIG. 3, a sealing layer may further be formed on the cathodes 190, in order to seal the OLEDs 100. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

EXAMPLES

A variety of dipole moments and reduction potentials of representative examples of the first matrix compounds were measured. The results are summarized in the below table 4.

TABLE 4

Dipole moments and reduction potentials of representative examples of the first matrix compound

| Compound | Name | Structure | Dipole moment/ Debye | Reduction potential against Fc/Fc+ in THF/V |
|---|---|---|---|---|
| ETM-1 | Tri(naphthalen-1-yl)borane | 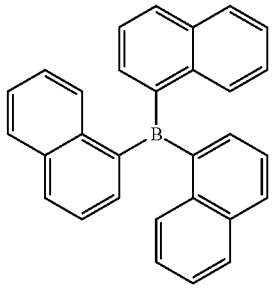 [SMILES: c1ccc2c(B(c3cccc4ccccc34)c3cccc4ccccc34)cccc2c1] | 0.14 | −2.31 |
| ETM-7 | bis(2-methylnaphthalen-1-yl)(3-(phenanthren-9-yl)phenyl)borane | 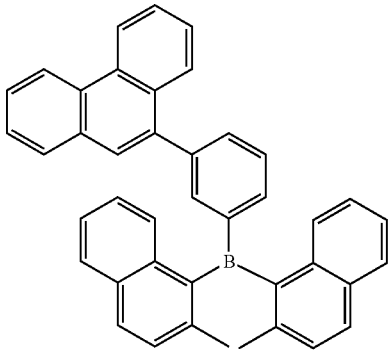 [SMILES: Cc1ccc2ccccc2c1B(c1cccc(-c2cc3ccccc3c3ccccc23)c1)c1c(C)ccc2ccccc12] | 0.18 | −2.35 |
| ETM-14 | 7-(3-(pyren-1-yl)phenyl)dibenzo[c,h]acridine | 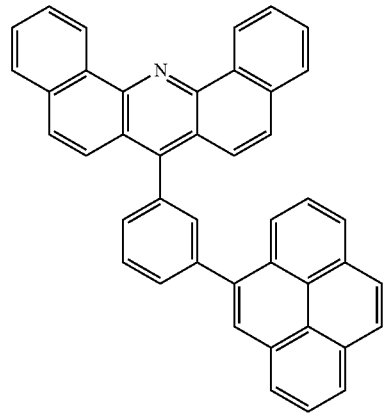 [SMILES: c1cc(-c2c3ccc4ccccc4c3nc3c2ccc2ccccc23)cc(-c2cc3cccc4ccc5cccc2c5c43)c1] | 1.80 | −2.26 |

TABLE 4-continued

Dipole moments and reduction potentials of representative examples of the first matrix compound

| Compound | Name | Structure | Dipole moment/ Debye | Reduction potential against Fc/Fc+ in THF/V |
|---|---|---|---|---|
| ETM-16 | 7-(3-(pyridin-4-yl)phenyl) dibenzo[c,h]acridine | | 2.26 | −2.27 |
| ETM-17 | 14-(3-(pyren-1-yl)phenyl) dibenzo[a,j] acridine | | 2.50 | −2.3 |
| ETM-36 | 7-(3-(pyren-1-yl)phenyl) benzo[c]acridine | | 2.13 | −2.2 |
| ETM-28 | 2-(3-(phenanthren-9-yl)-5-(pyridin-2-yl)phenyl)-4,6-diphenyl-1,3,5-triazine | | 1.76 | −2.17 |

TABLE 4-continued

Dipole moments and reduction potentials of representative examples of the first matrix compound

| Compound | Name | Structure | Dipole moment/ Debye | Reduction potential against Fc/Fc+ in THF/V |
|---|---|---|---|---|
| ETM-27 | 2,4-diphenyl-6-(5'''-phenyl-[1,1':3',1'':3'',1''':3''',1''''-quinquephenyl]-3-yl)-1,3,5-triazine | | 0.2 | −2.19 |
| ETM-25 | 2-([1,1'-biphenyl]-3-yl)-4-(3'-(4,6-diphenyl-1,3,5-triazin-2-yl)-[1,1'-biphenyl]-3-yl)-6-phenyl-1,3,5-triazine | | 0.13 | −2.24 |
| ETM-26 | 2-(3'-(4,6-diphenyl-1,3,5-triazin-2-yl)-[1,1-biphenyl]-3-yl)-4-phenylbenzo[4,5]thieno[3,2-d]pyrimidine | | 2.0 | −2.20 |
| ETM-31 | 2-phenyl-4-(4',5',6'-triphenyl-[1,1':2',1'':3'',1'''-quaterphenyl]-3'''-yl)benzo[4,5]thieno[3,2-d]pyrimidine | | 1.6 | −2.23 |

TABLE 4-continued

Dipole moments and reduction potentials of representative examples of the first matrix compound

| Compound | Name | Structure | Dipole moment/ Debye | Reduction potential against Fc/Fc+ in THF/V |
|---|---|---|---|---|
| ETM-32 | 7,12-diphenylbenzo[k]fluoranthene (CAS 16391-62-1) | 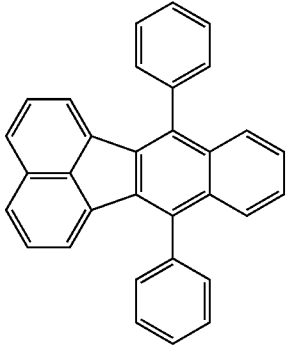 [SMILES: c1ccc(-c2c3c(c(-c4ccccc4)c4ccccc24)-c2cccc4cccc-3c24)cc1] | 0.13 | −2.2 |
| ETM-33 | 3,9-di(naphthalen-2-yl)perylene (CAS 959611-30-4) | 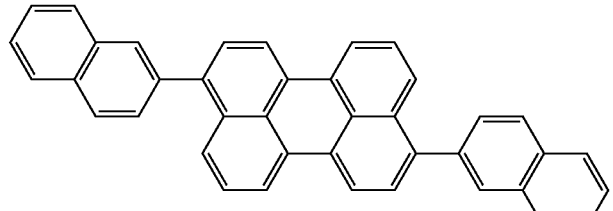 | 0.12 | −2.1 |

A variety of dipole moments of representative examples of the second matrix compounds were calculated. The results are summarized in the below Table 5.

TABLE 5

Dipole moments of representative examples of the second matrix compound

| Compound | Name | Structure | Dipole moment/Debye |
|---|---|---|---|
| EIM-19 | 1,2-diphenyl-1H-benzo[d]imidazole | 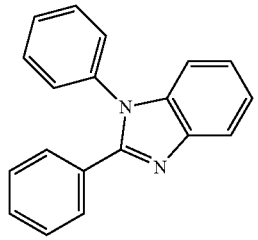 [SMILES: c1ccc(-c2nc3ccccc3n2-c2ccccc2)cc1] | 3.75 |
| EIM-20 | Triphenylphosphine oxide | 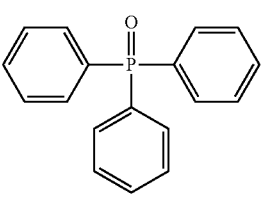 [SMILES: O=P(c1ccccc1)(c1ccccc1)c1ccccc1] | 3.97 |

TABLE 5-continued

Dipole moments of representative examples of the second matrix compound

| Compound | Name | Structure | Dipole moment/Debye |
|---|---|---|---|
| EIM-21 | 4,7-diphenyl-1,10-phenanthroline | | 3.65 |
| EIM-16 | 9-phenyl-9'-(quinazolin-2-yl)-9H,9'H-3,3'-bicarbazole | | 3.2/1.65*) |
| EIM-17 | 4-(2-naphthalenyl)-2-[4-(3-quinolinyl)phenyl]-benzo[h]quinazoline | | 3 |
| EIM-18 | 4-(naphthalen-1-yl)-2,7,9-triphenylpyrido[3,2-h]quinazoline | | 3.81 |

*)Two conformers with a difference of 1 kJ/mol difference in total energy. Therefore, both conformers are present at room temperature.

Synthetic Procedures

Synthesis of Compound ETM-3 ([1,1':4',1"-terphenyl]-3-ylbis(2-methylnaphthalen-1-yl)borane)

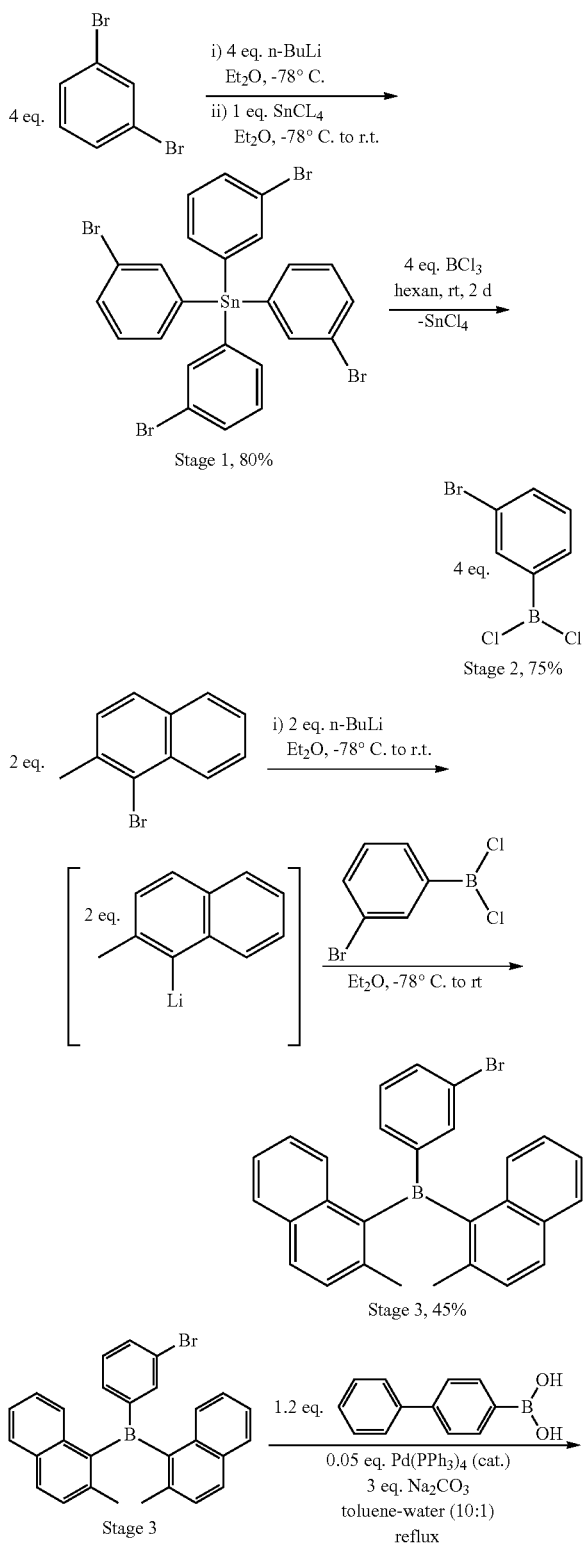

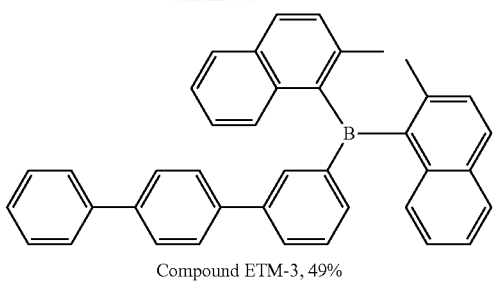

Compound ETM-3, 49%

1. Tetrakis(3-bromophenyl)stannane Stage 1

Sn(m-C$_6$H$_4$Br)$_4$: 1,3-Dibromobenzene (5.89 g, 24.97 mmol) was dissolved in 60 mL of ether and cooled to −50° C. Then 16.2 mL of a 1.6 M solution of nBuLi (26.00 mmol) in hexane was added dropwise. After having been stirred for 120 min the reaction mixture was cooled to −78° C., and 0.73 mL (6.25 mmol) of SnCl$_4$ was added dropwise. After the mixture was stirred for 12 h at ambient temperature, 20 mL of 1 M HCl was added, and the product was extracted with ether (3×70 mL). The organic phase was washed with H$_2$O and dried with MgSO$_4$. After removal of the solvent in vacuo, 30 mL of cold MeOH was added to the resulting oil and the mixture was stirring at 0-5° C. The precipitate was filtered and washed with cold MeOH (1×3 mL). After drying in vacuo Sn(m-C$_6$H$_4$Br) was obtained as a colorless crystalline powder (3.70 g, 5.00 mmol, 80% yield). M.p. 119-120° C. IR (ATR): U=1553, 1456, 1382, 1188, 1081, 996, 771, 715, 681, 643 cm$^{-1}$. $^1$H NMR (400 MHz, CDCl$_3$): δ=7.64-7.62 (m, 4H), 7.61-7.56 (m, 4H), 7.44 (d, $^3$J(H—H)= 7.3 Hz, 4H), 7.32 (t, $^3$J(H—H)=7.6 Hz, 4H) ppm; $^{13}$C NMR (100 MHz, CDCl$_3$): δ=139.1 ($^2$J($^{119}$Sn—C)=41.8 Hz, CH), 138.8 ($^1$J($^{119}$Sn—C)=528.2 Hz, Sn—C), 135.2 ($^2$J($^{119}$Sn—C)=35.2 Hz, CH), 133.0 ($^4$J($^{119}$Sn—C)=11.0 Hz, CH), 130.7 ($^3$J($^{119}$Sn—C)=55.0 Hz, CH), 124.2 (Br—C) ppm. MS: [M]$^+$ (0.1%) 739.7, [M-Br]$^+$ (0.1%) 660.8, [M-C$_6$H$_4$Br]$^+$ (20%) 584.8, [M-2C$_6$H$_4$Br]$^+$ (7%) 429.8, [M-3C$_6$H$_4$Br]$^+$ (27%) 274.9, PhSn (100) 196.9.

2. (3-Bromophenyl)dichloroborane Stage 2

To a 50 mL (50.00 mmol) of 1M solution of BCl$_3$ in hexane at −78° C. was added 7.43 g (10.00 mmol) of Sn(m-C$_6$H$_4$Br)$_4$ and the resulting mixture was stirring 1 h at −78° C. and 2 d at r.t. After removal of volatiles (hexane, SnCl$_4$ and excess of BCl$_3$) with membrane pump (70-75° C. oil bad, 40 mbar), the residue was distilled in vacuo at 105-110° C. (oil bad)/0.2 mbar giving 7.06 g (29.70 mmol, 75%) of (3-bromophenyl)dichloroborane.—$^1$H-NMR (400 MHz, CDCl$_3$): δ=7.37 (t, J=7.8 Hz, 1H), 7.77 (ddd, J=7.8, 2.1, 1.1 Hz, 1H), 8.06 (ddd, J=7.8, 2.1, 1.1 Hz, 1H), 8.24 (dd, J=2.1, 1.1 Hz, 1H) ppm. $^{13}$C NMR (100 MHz, CDCl$_3$): δ=139.3 (CH), 137.8 (CH), 137.6 (B—C), 135.2 (CH), 129.9 (CH), 122.9 (Br—C) ppm. $^{11}$B NMR (192 MHz, CDCl$_3$) δ=54.9 ppm.

3. (3-Bromophenyl)bis(2-methylnaphthalen-1-yl)borane Stage 3

To a solution of 4.00 g (3.60 g of pure compound, 16.00 mmol) 90% 1-bromo-2-methylnaphthalene in 80 ml of diethyl ether at −78° C. was added drop wise in 15 min 11 mL (17.6 mmol) 1.6 M nBuLi. After stirring at −78° C. for 1 h and at 0° C. for 2 h to the resulting mixture cooled to −78° C. was added in 5 min at vigorous stirring 2.02 g (8.50 mmol) (3-bromophenyl)dichloroborane. After stirring for 1 h at −78° C. the cooling bad was removed and reactions mixture was stirring additionally over night at ambient temperature, then cooled to 5° C. and quenched with 5 drops of conc. HCl. Ether was removed in vacuo, the residue was mixed with water (100 mL), extracted with $CHCl_3$ (3×70 mL), organic lay was washed with water and dried with calcium chloride. Borane Stage 3 was purified by a silica gel column chromatography using petrol ether as eluent to give a light yellow solid (1.65 g, 3.67 mmol, 45%). M.p. 157-158° C. IR (ATR): U=1592, 1505, 1421, 1389, 1225, 1192, 808, 743, 604, 510, 503 cm$^{-1}$. $^1$H NMR (600 MHz, $CDCl_3$) δ=7.86-7.79 (m, 4H), 7.61-7.53 (m, 4H), 7.37-7.28 (m, 5H), 7.18-7.11 (m, 3H), 2.24 (s, 6H, Me) ppm. $^{13}$C NMR (150 MHz, $CDCl_3$): δ=148.4 (br s, B—$C_{Phenyl}$), 141.9 (br s, 2C, B—$C_{Naphthyl}$), 139.6 (2Cq), 139.2 (CH), 135.9 (2Cq), 135.6 (CH), 135.3 (CH), 131.8 (Cq), 131.7 (Cq), 130.1 (CH), 130.0 (CH), 129.9 (CH), 129.5 (CH), 129.4 (CH), 129.1 (CH), 129.0 (CH), 128.5 (CH), 128.4 (CH), 125.5 (2CH), 124.5 (2CH), 122.9 (C—Br), 23.8 (Me), 23.6 (Me) ppm. $^{11}$B NMR (192 MHz, $CDCl_3$) δ=74.3 ppm. MS: [M]$^+$ (12%) 448; [M-(1-methylnaphthalene)]$^+$ (17%) 306; [M-(1-methylnaphthalene)-Br]$^+$ (12%) 227; [1-methylnaphthalene]$^+$ (28%) 142.

4. [1,1':4',1''-terphenyl]-3-ylbis(2-methylnaphthalen-1-yl)borane Compound ETM-3

A mixture of borane Stage 3 (90 mg, 0.20 mmol), Pd(PPh$_3$)$_4$ (12 mg, 5 mol. %, 0.01 mmol), 1,1'-biphenyl]-4-ylboronic acid (48 mg, 0.24 mmol), Na$_2$CO$_3$ (64 mg, 0.60 mmol) and 1 mL water in toluene (15 mL) was degassed by N$_2$ bubbling for 15 min. The reaction mixture was then heated to 105-110° C. and monitored via TLC until complete, typically 8-12 h. After removal of the solvent, the residue was diluted with 10 mL water, acidified with 3 drops conc. HCl, extracted with CHCl$_3$ (3×20 mL), the organic lay was washed with water and dried with calcium chloride. Compound ETM-3 was purified by a silica gel column chromatography using petrol ether as eluent to give a white solid (51 mg, 0.098 mmol, 49%). M.p. 180-181° C. Tg 87° C. IR (ATR): U=1591, 1506, 1420, 1384, 1224, 1189, 811, 740, 606, 512, 505 cm$^{-1}$. $^1$H NMR (400 MHz, CDCl$_3$) δ=7.85 (d, J=8.3 Hz, 4H), 7.79-7.65 (m, 5H), 7.60-7.53 (m, 4H), 7.49-7.39 (m, 5H), 7.38-7.31 (m, 5H), 7.18 (d, J=7.6 Hz, 1H), 7.14 (d, J=7.5 Hz, 1H), 2.31 (s, 3H, Me), 2.30 (s, 3H, Me) ppm. $^{13}$C NMR (100 MHz, CDCl$_3$): δ=146.2 (br s, B—$C_{Phenyl}$), 142.5 (br s, 2C, B—$C_{Naphthyl}$), 140.6 (Cq), 140.1 (Cq), 140.0 (Cq), 139.9 (Cq), 139.5 (2Cq), 136.6 (CH), 136.2 (Cq), 136.1 (Cq), 136.0 (CH), 131.8 (Cq), 131.7 (Cq), 131.3 (CH), 129.9 (CH), 129.8 (2CH), 129.7 (CH), 129.2 (2CH), 128.8 (2CH), 128.6 (CH), 128.5 (CH), 128.4 (CH), 127.5 (2CH), 127.4 (2CH), 127.3 (CH), 127.0 (2CH), 125.3 (2CH), 124.4 (2CH), 23.9 (Me), 23.7 (Me) ppm. MS: [M]$^+$ (35%) 522; [M-(1-methylnaphthalene)]$^+$ (98%) 380; [M-(1-methylnaphthalene)-Ph+2H]$^+$ (100%) 306; [1-methylnaphthalene]$^+$ (72%) 142.

Synthesis of Compound ETM-7 (bis(2-methylnaphthalen-1-yl)(3-(phenanthren-9-yl)phenyl)borane)

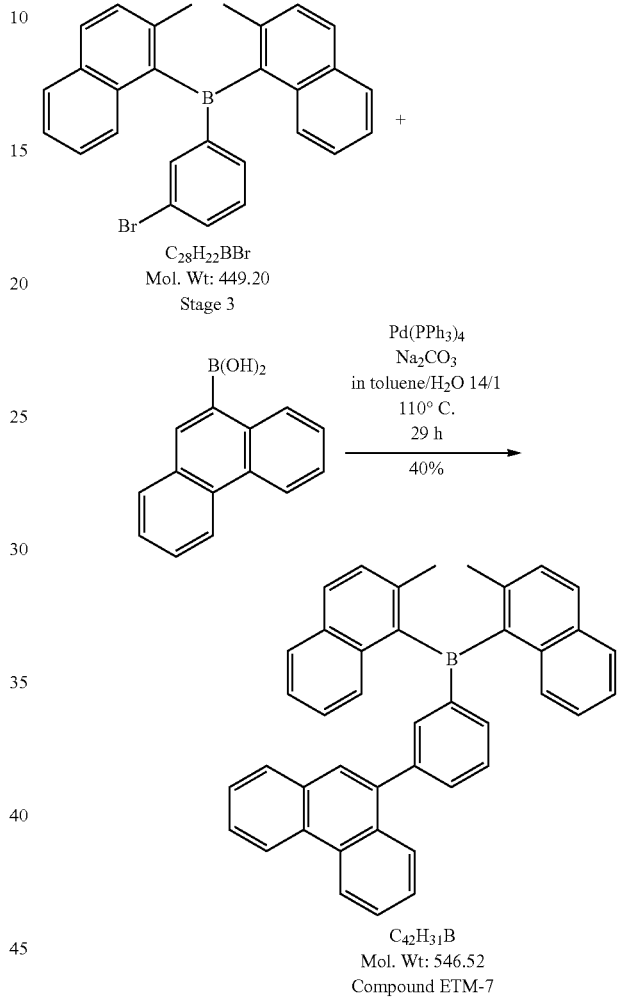

C$_{28}$H$_{22}$BBr
Mol. Wt: 449.20
Stage 3

C$_{42}$H$_{31}$B
Mol. Wt: 546.52
Compound ETM-7

A mixture of (3-bromophenyl)bis(2-methylnaphthalen-1-yl)borane (Stage 3) (2.00 g, 4.45 mmol), Pd(PPh$_3$)$_4$ (0.26 mg, 5 mol. %, 0.22 mmol), phenanthren-9-ylboronic acid (1.19 g, 5.36 mmol), Na$_2$CO$_3$ (1.40 g, 13.21 mmol) and 22 mL water in toluene (306 mL) was degassed by N$_2$ bubbling for 1 h. The reaction mixture was then heated to 110° C. and monitored via TLC until complete (29 h). After cooling to room temperature, the two phases were separated and the organic layer was washed with water (4×200 mL). Additionally, the organic layer was stirred twice with NaDTC (2×15 min) to remove palladium residues. After washing once more with water, the organic layer was dried with calcium chloride. The raw product was purified by column chromatography using hexane/ethylacetate 98:2 as eluent to give a white solid (950 mg, 1.74 mmol, 40%). HPLC-MS 97%, GC-MS 99.6% (m/z 546), Tg 102° C. (from DSC 10 K/min), no melting point observed. $^1$H NMR (500 MHz, CD$_2$Cl$_2$) δ 8.78 (d, 1H), 8.68 (d, 1H), 7.93-7.82 (m, 6H), 7.82-7.76 (d, 1H), 7.76-7.70 (m, 1H), 7.68 (s, 1H), 7.66-7.55

(m, 6H), 7.55-7.48 (m, 1H), 7.48-7.39 (m, 2H), 7.39-7.33 (m, 2H), 7.33-7.22 (m, 3H), 2.38 (s, 3H, Me), 2.35 (s, 3H, Me) ppm. $^{13}$C NMR (125 MHz, CD$_2$Cl$_2$): δ=146.5 (br, a B—C$_{phenyl}$), 143.1 (br, s, B—C$_{naphthyl}$), 141.0, 140.2 (d, J=7.3 Hz), 139.6, 139.0, 136.8 (d, J=11.4 Hz), 134.9, 132.6 (d, J=3.8 Hz), 132.0, 131.3, 131.0, 130.6, 130.4, 129.7, 129.1, 129.0, 128.1, 127.4, 127.2 (d, J=8.0 Hz), 127.0, 126.9, 125.9 (d, J=6.2 Hz), 125.1 (d, J=1.7 Hz), 123.4, 123.0, 24.2 (CH$_3$), 23.9 (CH$_3$) ppm.

Other compounds, mentioned herein, were prepared accordingly. A person skilled in the art will understand that the specific reaction conditions for preparing the respective compounds may be slightly modified on basis of the general knowledge of this person to prepare the respective compounds.

General Procedure for Fabrication of OLEDs

For bottom emission devices, Examples 1 to 5 and comparative examples 1 to 4, a 15 Ω/cm 2 glass substrate (available from Corning Co.) with 100 nm ITO was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

Then, 92 wt.-% of a hole transport matrix doped with 8 wt.-% and 8 wt.-% of 2,2',2''-(cyclopropane-1,2,3-triylidene)tris(2-(p-cyanotetrafluorophenyl)acetonitrile) was vacuum deposited on the ITO electrode, to form a HIL having a thickness of 10 nm. Then, the hole transport matrix was vacuum deposited on the HIL, to form a HTL having a thickness of 120 nm. For Examples 1 to 3 and Comparative examples 1 to 4 Biphenyl-4-yl(9,9-diphenyl-9H-fluoren-2-yl)-[4-(9-phenyl-9H-carbazol-3-yl)phenyl]-amine (CAS 1242056-42-3) was used as hole transport matrix. For Examples 4 and 5, N4,N4''-di(naphthalen-1-yl)-N4,N4''-diphenyl-[1,1':4',1''-terphenyl]-4,4''-diamine (CAS 139255-16-6) was used as hole transport matrix.

Then 97 wt.-% of ABH113 (Sun Fine Chemicals) as EML host and 3 wt.-% blue dopant were deposited on the HTL, to form a blue-emitting EML with a thickness of 20 nm. For Examples 1 to 3 and Comparative examples 1 to 4, NUBD370 (Sun Fine Chemicals) was used a blue dopant. For Examples 4 and 5, NUBD005 (Sun Fine Chemicals) was used a blue dopant.

Then the undoped electron transport layer (ETL) is formed by depositing a matrix compound according to Example 1 to Example 5 and Comparative examples 1 to 4, see Table 6. Then the electron injection layer (EIL) is formed by deposing 2-(4-(9,10-di(naphthalen-2-yl)anthracen-2-yl)phenyl-1-phenyl-1H-benzo[d]imidazole (CAS 561064-11-7) doped with 30 wt.-% LiQ (Comparative Example 1) or 3-Phenyl-3H-benzo[b]dinaphtho[2,1-d:1',2'-f]phosphepine-3-oxide (EIM-11), doped with 30 wt.-% Lithium tetra(1H-pyrazol-1-yl)borate (Li-1) (Example 1 to 5 and Comparative examples 2 to 4) to form a layer as specified in Table 6. The cathode was evaporated at ultra-high vacuum of 10$^{-7}$ mbar. Therefore, a thermal single co-evaporation of one or several metals was performed with a rate of 0, 1 to 10 nm/s (0.01 to 1 Å/s) in order to generate a homogeneous cathode with a thickness of 5 to 1000 nm. The cathode was formed from 100 nm aluminum.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 10 mA/cm$^2$ for bottom emission and 15 mA/cm$^2$ for top emission devices, a calibrated spectrometer CAS140 from Instrument Systems is used for measurement of CIE coordinates and brightness in Candela. Lifetime LT of the device is measured at ambient conditions (20° C.) and 15 mA/cm$^2$, using a Keithley 2400 sourcemeter, and recorded in hours. The brightness of the device is measured using a calibrated photo diode. The lifetime LT is defined as the time till the brightness of the device is reduced to 97% of its initial value.

The light output in external efficiency EQE and power efficiency (lm/W efficiency) are determined at 10 mA/cm$^2$ for bottom emission devices and 15 mA/cm$^2$ for top emission devices.

To determine the efficiency EQE in % the light output of the device is measured using a calibrated photodiode.

To determine the power efficiency in lm/W, in a first step the luminance in candela per square meter (cd/m2) is measured with an array spectrometer CAS140 CT from Instrument Systems which has been calibrated by Deutsche Akkreditierungsstelle (DAkkS). In a second step, the luminance is then multiplied by π and divided by the voltage and current density.

In bottom emission devices, the emission is predominately Lambertian and quantified in percent external quantum efficiency (EQE) and power efficiency in lm/W.

In top emission devices, the emission is forward directed, non-Lambertian and also highly dependent on the microcavity. Therefore, the external quantum efficiency (EQE) and power efficiency in lm/W will be higher compared to bottom emission devices.

Technical Effect of the Invention

Bottom Emission Devices

The beneficial effect of the invention on the performance of bottom emission devices can be seen in Table 6.

TABLE 6

Voltage, external quantum efficiency (EQE) and power efficiency (PEff) of bottom emission OLEDs measured at 10 mA/cm$^2$

| | ETL | d (ETL)/ nm | EIL | wt.-% Li organic complex*[1] | d (EIL)/ nm | V at 10 mA/cm$^2$/V | EQE*[2]/ % | PEff*[3]/ lm/W |
|---|---|---|---|---|---|---|---|---|
| Comparative example 1 | ADN | 36 | EIM-1:LiQ | 30 | 3 | 5.6 | 6 | 3.2 |
| Comparative example 2 | ADN | 36 | EIM-11:Li-1 | 30 | 3 | 3.2 | 4.5 | 4.1 |
| Comparative example 3 | Formula (A) | 36 | EIM-11:Li-1 | 30 | 3 | 4.8 | 3.5 | 2 |
| Comparative example 4 | EIM-9 | 36 | EIM-11:Li-1 | 30 | 3 | 5.3 | 4.6 | 2.4 |

TABLE 6-continued

Voltage, external quantum efficiency (EQE) and power efficiency
(PEff) of bottom emission OLEDs measured at 10 mA/cm$^2$

|  | ETL | d (ETL)/ nm | EIL | wt.-% Li organic complex*[1] | d (EIL)/ nm | V at 10 mA/cm$^2$/V | EQE*[2]/ % | PEff*[3]/ lm/W |
|---|---|---|---|---|---|---|---|---|
| Example 1 | ETM-3 | 36 | EIM-11:Li-1 | 30 | 3 | 3.25 | 5.4 | 4.85 |
| Example 2 | ETM-1 | 36 | EIM-11:Li-1 | 30 | 3 | 3.35 | 6.4 | 6.1 |
| Example 3 | ETM-28 | 36 | EIM-11:Li-1 | 30 | 3 | 3.8 | 7.3 | 5.3 |
| Example 4 | ETM-15 | 36 | EIM-11:Li-1 | 30 | 3 | 3.2 | 7.3 | 5.7 |
| Example 5 | ETM-34 | 36 | EIM-11:Li-1 | 30 | 3 | 3.3 | 6.8 | 4.9 |

*[1] the wt.-% of the matrix compound MX and the wt.-% of the lithium organic complex are in total 100 wt.-% based on the weight of the EIL.
*[2] detecting the light output efficiency with a calibrated photo diode.
*[3] calculated lm/W efficiency based on the luminance in cd/m$^2$, voltage in Volt and current density in mA/cm$^2$.

In comparative Example 1, Table 6, anthracene compound ADN (9,10-di(naphthalen-2-yl)anthracene, CAS 122648-99-1) is tested as first matrix compound.

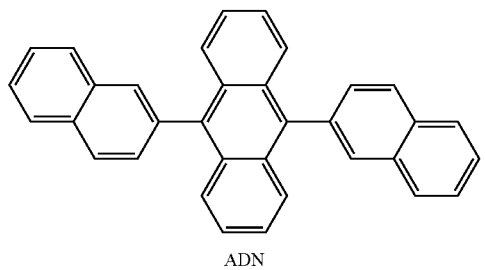 [SMILES: c1ccc2cc(-c3c4ccccc4c(-c4ccc5ccccc5c4)c4ccccc34)ccc2c1]

ADN

The reduction potential is −2.44 V against Fc/Fc$^+$ in tetrahydrofurane and the dipole moment is 0.01 Debye. The reduction potential and LUMO level of the first matrix compound are the same as of the EML host. The EIL comprises benzimidazole compound EIM-1 and lithium organic complex LiQ. The power efficiency is 3.2 lm/W (Table 6).

In comparative Example 2, first matrix compound ADN is tested with an EIL comprising phosphine oxide compound EIM-11 and lithium organic complex Li-1. The power efficiency is improved to 4.1 lm/W.

In comparative Example 3, triazine compound 4,4′-bis(4,6-diphenyl-1,3,5-triazin-2-yl)biphenyl (CAS 266349-83-1) of formula (A) is tested as first matrix compound.

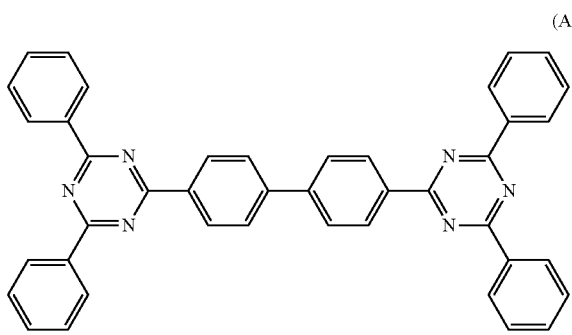

(A)

The reduction potential is −2.03 V against Fc/Fc$^+$ in tetrahydrofurane and the dipole moment is 0.03 Debye. The EIL composition is selected the same as in comparative example 2. The power efficiency is reduced to 2 lm/W. Clearly, a very large off-set in reduction potential and LUMO of the EML host compared to the ETL matrix has a detrimental effect on power efficiency.

In comparative Example 4, phosphine oxide compound EIM-9 with a reduction potential of −2.2 V against Fc/Fc$^+$ in tetrahydrofurane is tested as ETL matrix. The dipole moment of this compound is 4 Debye. Therefore, this compound is a polar compound in the sense of the present invention. The EIL composition is selected the same as in comparative examples 2. The power efficiency is reduced compared to comparative example 2, 2.4 V against 4.1 V for comparative example 2 (Table 6). Even though the off-set in reduction potential between the EML matrix and ETL matrix is within the desired range, the high dipole moment of the ETL matrix compound results in low power efficiency.

In Example 1, Table 6, triaryl borane compound ETM-3 is tested with the same EIL composition as in comparative example 2. The reduction potential of ETM-3 is −2.33 V against F/Fc$^+$ in tetrahydrofurane and the dipole moment is <2.5 Debye. The power efficiency is improved from 4.1 to 4.85 lm/W.

In Example 2, a triaryl borane compound with a deeper LUMO compared to Example 1 is tested. The reduction potential of ETM-1 is −2.31 V against Fc/Fc$^+$ in tetrahydrofurane and the dipole moment is 0.14 Debye. The power efficiency is further improved from 4.85 to 6.1 lm/W.

In Example 3, triazine compound ETM-28 is tested with the same EIL composition as in comparative example 2. The reduction potential is −2.17 V against Fc/Fc$^+$ in tetrahydrofurane and the dipole moment is 1.76 Debye. The power efficiency is improved from 4.1 lm/W in comparative example 2 to 5.3 lm/W in Example 3.

In Example 5, dibenzo[c,h]acridine compound ETM-15 is tested with the same EIL composition as in comparative example 2. The reduction potential is −2.26 V against Fc/Fc$^+$ in tetrahydrofurane and the dipole moment is between 1.5 and 2 Debye. The power efficiency is improved from 4.1 lm/W in comparative example 2 to 5.7 lm/W in Example 5.

In Example 6, tris(2-(benzo[d]thiazol-2-yl)phenoxy)aluminum metal complex ETM-34 is tested with the same EIL composition as in comparative example 2. The reduction potential is −2.21 V against Fc/Fc$^+$ in tetrahydrofurane and the dipole moment is ≤2.5 Debye. The power efficiency is improved from 4.1 lm/W in comparative example 2 to 4.9 lm/W in Example 6.

In summary, a significant improvement in power efficiency (lm/W efficiency) has been achieved for a wide range of first matrix compound classes with a reduction potential less negative than the reduction potential of 9,10-di(naphthalen-2-yl)anthracene (CAS 122648-99-1) and more negative than the reduction potential of 4,4'-bis(4,6-diphenyl-1,3,5-triazin-2-yl)biphenyl (CAS 266349-83-1) and a dipole moment between ≥0 Debye and ≤2.5 Debye.

Another aspect is directed to an organic light-emitting diode (OLED) comprising more than one emission layer (EML) 150, for example two, three or four emission layers may be present. An organic light-emitting diode (OLED) comprising more than one emission layer is also described as a tandem OLED or stacked OLED.

Another aspect is directed to a device comprising at least one organic light-emitting diode (OLED). A device comprising organic light-emitting diodes (OLED) is for example a display or a lighting panel.

The features disclosed in the foregoing description, in the claims and the accompanying drawing may, both separately or in any combination, be material for realizing the invention in diverse forms thereof.

The invention claimed is:

1. Organic electroluminescent device comprising an anode, a cathode, an emission layer, an undoped electron transport layer comprising a first matrix compound, and an electron injection layer comprising a second matrix compound and an alkali organic complex and/or alkali halide, wherein the undoped electron transport layer and the electron injection layer are arranged between the emission layer and the cathode, wherein the reduction potential of the first matrix compound is less negative than the reduction potential of 9,10-di(naphthalen-2-yl)anthracene and more negative than the reduction potential of 4,4'-bis(4,6-diphenyl-1,3,5-triazin-2-yl)biphenyl, wherein the reduction potential in both cases is measured against Fc/Fc$^+$ in tetrahydrofurane;

wherein the dipole moment of the first matrix compound is selected 0 Debye and ≤2.5 Debye and the dipole moment of the second matrix compound is selected >2.5 and <10 Debye;

the emission layer is in direct contact with the undoped electron transport layer;

the emission layer comprises an emission layer host; and the off-set between the reduction potential of the emission layer host and the reduction potential of the first matrix compound is ≥0.1 and ≤0.3 V;

wherein the first matrix compound is selected from the following compounds or derivatives thereof, the compounds being dibenzo[c,h]acridine, dibenzo[a,j]acridine, benzo[c]acridine, triaryl borane compounds, 2-(benzo[d]thiazol-2-yl)phenoxy metal complex, triazine, benzothienopyrimidine, or mixtures thereof;

wherein the second matrix compound is selected from the following compounds or derivatives thereof, the compounds being phosphine oxide, benzimidazole, phenanthroline, or mixtures thereof; and wherein the alkali organic complex is a lithium organic complex and/or the alkali halide is lithium halide.

2. Organic electroluminescent device according to claim 1, wherein the first matrix compound comprises a triaryl borane compound of formula (I)

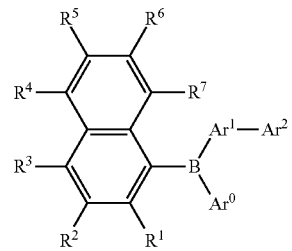

wherein $R^1$, $R^3$ and $R^7$ are independently selected from a group consisting of H, D, $C_1$-$C_{16}$ alkyl and $C_1$-$C_{16}$ alkoxy;

$R^2$, $R^4$, $R^5$ and $R^6$ are independently selected from a group consisting of H, D, $C_1$-$C_{16}$ alkyl, $C_1$-$C_{16}$ alkoxy and $C_6$-$C_{20}$ aryl;

$Ar^0$ is selected from substituted or unsubstituted $C_6$-$C_{20}$ aryl, wherein, in case that $Ar^0$ is substituted, the substituents are independently selected from a group consisting of D, $C_1$-$C_{12}$ alkyl, $C_1$-$C_{16}$ alkoxy and $C_6$-$C_{20}$ aryl; and $Ar^1$ is selected from substituted or unsubstituted $C_6$-$C_{20}$ arylene, wherein, in case that $Ar^1$ is substituted, the substituents are independently selected from a group consisting of D, $C_1$-$C_{12}$ alkyl, $C_1$-$C_{16}$ alkoxy and $C_6$-$C_{20}$ aryl; and $Ar^2$ is selected from a group consisting of H, D, substituted or unsubstituted $C_6$-$C_{40}$ aryl and $C_5$-$C_{40}$ heteroaryl.

3. Organic electroluminescent device according to claim 1, wherein the first matrix compound comprises a dibenzo[c,h]acridine compound of formula (II)

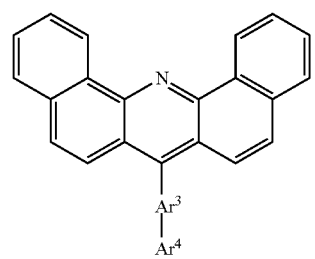

and/or a dibenzo[a,j]acridine compound of formula (III)

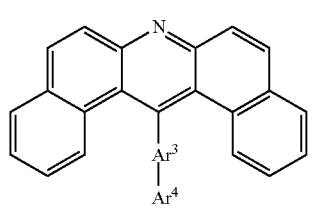

and/or a benzo[c]acridine compound of formula (IV)

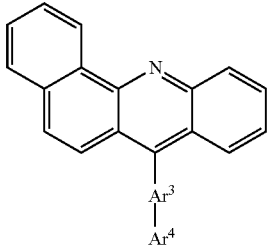

(IV)

wherein $Ar^3$ is independently selected from $C_6$-$C_{20}$ arylene;

$Ar^4$ is independently selected from unsubstituted or substituted $C_6$-$C_{40}$ aryl;

and in case that $Ar^4$ is substituted, the one or more substituents may be independently selected from the group consisting of $C_1$-$C_{12}$ alkyl and $C_1$-$C_{12}$ heteroalkyl.

4. Organic electroluminescent device according to claim 1, wherein the first matrix compound comprises a triazine compound of formula (V)

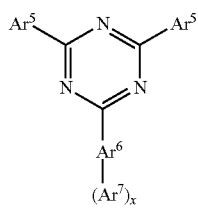

(V)

wherein $Ar^5$ is independently selected from unsubstituted or substituted $C_6$-$C_{20}$ aryl or $Ar^{5.1}$-$Ar^{5.2}$, wherein $Ar^{5.1}$ is selected from unsubstituted or substituted $C_6$-$C_{20}$ arylene and $Ar^{5.2}$ is selected from unsubstituted or substituted $C_6$-$C_{20}$ aryl or unsubstituted and substituted $C_5$-$C_{20}$ heteroaryl;

$Ar^6$ is selected from unsubstituted or substituted $C_6$-$C_{20}$ arylene;

$Ar^7$ is independently selected from a group consisting of substituted or unsubstituted aryl, substituted or unsubstituted heteroaryl, the aryl and the heteroaryl having 6 to 40 ring-forming atoms;

x is selected from 1 or 2, wherein in case that $Ar^5$ is substituted the one or more substituents may independently be selected from $C_1$-$C_{12}$ alkyl and $C_1$-$C_{12}$ heteroalkyl;

and in case that $Ar^7$ is substituted, the one or more substituents may be independently selected from $C_1$-$C_{12}$ alkyl and $C_1$-$C_{12}$ heteroalkyl, and from $C_6$-$C_{20}$ aryl.

5. Organic electroluminescent device according to claim 1, wherein the first matrix compound comprises benzothienopyrimidine compound substituted with $C_6$-$C_{40}$ aryl, $C_5$-$C_{40}$ heteroaryl and/or $C_1$-$C_{12}$ alkyl groups.

6. Organic electroluminescent device according to claim 1, wherein the alkali organic complex is a compound of formula (VII)

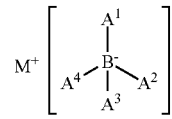

(VII)

wherein M is an alkali metal ion, each of $A^1$-$A^4$ is independently selected from substituted or unsubstituted $C_6$-$C_{20}$ aryl or substituted or unsubstituted $C_2$-$C_{20}$ heteroaryl.

7. Organic electroluminescent device according to claim 1, wherein the thickness of the undoped electron transport layer is at least two times the thickness of the electron injection layer.

8. Organic electroluminescent device according to claim 1, wherein the emission layer comprises a fluorescent blue emitter.

9. Organic electroluminescent device according to claim 8, wherein the organic electroluminescent device is a fluorescent blue device.

10. Organic electroluminescent device according to claim 9, wherein the emission layer further comprises an anthracene matrix compound substituted with $C_6$-$C_{40}$ aryl, $C_5$-$C_{40}$ heteroaryl and/or $C_1$-$C_{12}$ alkyl groups.

11. Organic electroluminescent device according to claim 3, wherein $Ar^3$ is phenylene, biphenylene, or fluorenylene.

12. Organic electroluminescent device according to claim 3, wherein $Ar^4$ is phenyl, naphthyl, anthranyl, pyrenyl, or phenanthryl.

13. Organic electroluminescent device according to claim 4, wherein $Ar^6$ is phenylene, biphenylene, terphenylene, or fluorenylene.

14. Organic electroluminescent device according to claim 4, wherein $Ar^7$ is phenyl, naphthyl, phenantryl, fluorenyl, terphenyl, pyridyl, quinolyl, pyrimidyl, triazinyl, benzo[h]quinolinyl, or benzo[4,5]thieno[3,2-d]pyrimidine.

15. Organic electroluminescent device according to claim 5, wherein the first matrix compound comprises 2-phenyl-4-(4',5',6'-triphenyl-[1,1':2',1":3",1'''-quaterphenyl]-3'''-yl)benzo[4,5]thieno[3,2-d]pyrimidine.

* * * * *